United States Patent

Irie

[11] Patent Number: 5,973,442
[45] Date of Patent: Oct. 26, 1999

[54] PIEZO-RESONATOR, FILTER AND AM RECEIVING CIRCUITRY USING PIEZO-RESONATOR

[75] Inventor: Makoto Irie, Toyama, Japan

[73] Assignee: Murata Manufacturing Co., Ltd., Japan

[21] Appl. No.: 08/803,126

[22] Filed: Feb. 20, 1997

[30] Foreign Application Priority Data

Feb. 22, 1996 [JP] Japan .................................. 8-061946

[51] Int. Cl.$^6$ ........................... H03H 9/13; H01L 41/047
[52] U.S. Cl. ........................................ 310/366; 310/321
[58] Field of Search .................................. 310/320, 321, 310/365, 366

[56] References Cited

U.S. PATENT DOCUMENTS

| | | | |
|---|---|---|---|
| 2,262,966 | 11/1941 | Rohde | 310/366 |
| 3,843,897 | 10/1974 | Mishiro | 310/323 |
| 5,057,802 | 10/1991 | Ozeki et al. | 310/348 |
| 5,392,012 | 2/1995 | Iwata et al. | 310/348 |
| 5,717,365 | 2/1998 | Kaida et al. | 310/348 |
| 5,765,046 | 6/1998 | Watanabe et al. | 310/348 |
| 5,859,488 | 1/1999 | Okeshi et al. | 310/368 |

*Primary Examiner*—Thomas M. Dougherty
*Attorney, Agent, or Firm*—Joseph R. Keating, Esq.; Graham & James LLP

[57] ABSTRACT

A piezo-resonator included in a filter and/or an AM signal receiving circuit eliminates unwanted signals produced as a result of the piezo-resonator experiencing a mechanical impact. The piezo-resonator includes a piezoelectric substrate and first and second electrodes provided on opposite surfaces of the substrate. The first electrode is divided into three portions along its width by grooves extending along the longitudinal substrate. The grooves are formed so that the resulting divided portions are substantially symmetrical to each other with respect to the central axis extending along the longitudinal substrate. The peripheral portions of the divided electrode are used as one input/output terminal, while the central portion is used as the other input/output terminal. The piezo-resonator can be provided in at least the last stage of a plurality of resonators for use in a filter. Further, such piezo-resonators or filter can be used in an intermediate frequency filter contained in an AM signal receiving device.

4 Claims, 25 Drawing Sheets

PIEZO-RESONATOR, FILTER AND AM RECEIVING CIRCUITRY USING PIEZO-RESONATOR

BACKGROUND OF THE INVENTION

1. Field of the Invention

The present invention relates generally to a piezo-resonator and a filter using the resonator. More particularly, the invention relates to a piezo-resonator for use in an intermediate frequency filter, which can be provided in, for example, an amplitude modulation (AM) radio. The invention also relates to a filter and AM signal receiving circuit containing the above-described resonator.

2. Description of the Related Art

Referring to a perspective view illustrating an example of known types of piezo-resonators shown in FIG. 27, a piezo-resonator generally designated by 1 includes a rectangular piezoelectric substrate 2. Electrodes 3 and 4 are formed on both top and bottom surfaces of the piezoelectric substrate 2. One electrode 3 is split into two electrode portions 3a and 3b along the width of the substrate 2 across a groove 5, the split portions 3a and 3b being used as input/output terminals 6a and 6b, respectively. The other electrode 4 serves as a ground electrode.

In this piezo-resonator 1, the longitudinal vibration mode of a piezoelectric device can be generated by using the two electrode portions 3a and 3b as the input/output electrodes. The frequency characteristics of the piezo-resonator 1 are shown in FIGS. 28 and 29. FIG. 29 illustrates the characteristics of and around the resonant frequency which are partially enlarged from the diagram of FIG. 28. It is seen that the piezo-resonator using the longitudinal vibration mode can be made smaller than the piezo-resonators operating in a square-type vibration mode.

The piezo-resonator operating in the longitudinal vibration mode can be used in an intermediate frequency filter to be installed in, for example, an AM radio. In an AM signal receiving device, a mixing circuit mixes a received signal with a signal output from a local oscillation circuit. An output signal from the mixing circuit passes through an intermediate frequency filter to extract an intermediate frequency signal. The intermediate frequency signal is then amplified in an intermediate-frequency amplifying circuit and further detected in a detection circuit. Subsequently, the detected signal is amplified in a low-frequency amplifying circuit to output an amplified signal, which then drives a speaker.

However, any external impact applied to the radio causes warpage and deformation of the piezo-resonator as illustrated in FIG. 30. Due to this warpage and deformation, one side of the piezoelectric substrate is expanded, while the other side is contracted, thereby generating electrical charges with opposite polarities in the substrate. These charges are disadvantageously output from the input/output terminals as a signal, which is further transmitted to a radio amplifier, to finally drive a speaker, causing the occurrence of noise. Thus, once the radio is dropped or receives a force sufficient to deform the piezo-resonator, the deformed piezo-resonator continuously generates electrical charges with opposite polarities resulting in the output of undesired signals which is heard as noise.

SUMMARY OF THE INVENTION

The preferred embodiments of the present invention provide a piezo-resonator in which the output of unwanted signals is prevented despite the resonator experiencing mechanical impact and deformation, and also to provide a filter and amplitude-modulation receiving device using the inventive piezo-resonator.

According to one preferred embodiment of the present invention, there is provided a piezo-resonator comprising: a substantially rectangular piezoelectric substrate; and at least two electrodes disposed on opposite surfaces of the piezoelectric substrate, at least one of the electrodes being divided into at least three portions along a width of the piezoelectric substrate, and two peripheral electrode portions of the divided electrode being substantially symmetrical to each other with respect to a central line extending along the piezoelectric substrate in a longitudinal direction of the piezoelectric substrate, wherein two input/output terminals and a ground terminal are respectively formed by the divided electrode and the other of the at least two electrodes, at least the two peripheral electrode portions of the divided electrode being connected to be used as one of the input/output terminals.

In the above piezo-resonator, at least one of the two electrodes may be divided in such a manner that the at least three divided portions are substantially parallel to a central line extending along the piezoelectric substrate in the longitudinal direction, and the total widths of the peripheral electrode portions may be substantially equal to a width of a central electrode portion.

Alternatively, at least one of the at least two electrodes may be divided in such a manner that the divided three portions are substantially parallel to the central line extending along the piezoelectric substrate in the longitudinal direction, and the width of each of the peripheral electrode portions may be substantially equal to the width of a divided central electrode portion.

Also, a conductive support member may be fixed to the divided electrode at a node of the piezoelectric substrate, and the divided electrode may be connected by the support member to a pattern electrode disposed on the insulating substrate.

According to another preferred embodiment of the present invention, there is provided a filter comprising a plurality of piezo-resonators connected thereto, wherein a resonator according to the preferred embodiment described above is used at least in the last stage of the plurality of piezo-resonators.

According to a further preferred embodiment of the present invention, there is provided an AM signal receiving device comprising: a mixing circuit for mixing a received signal with a signal from a local oscillation circuit; an intermediate frequency filter for extracting an intermediate frequency signal from an output signal of the mixing circuit; and a detection circuit for detecting a sound signal from the intermediate frequency signal obtained in the intermediate frequency filter, wherein the piezo-resonator or the filter according to the preferred embodiments described above is used as the intermediate frequency filter.

In the aforedescribed piezo-resonator, the two peripheral portions of the divided electrode are preferably connected to each other to be used as one input/output terminal, while the central portion serves as the other input/output terminal. The divided electrode can be divided into at least three portions in the widthwise direction of the substrate, thereby producing longitudinal vibration in the substrate. Filter characteristics can be obtained with the use of this longitudinal vibration mode.

If there is any external mechanical impact applied to such a piezo-resonator, warpage or deformation may occur in the substrate. This further generates electrical charges with opposite polarities in the two peripheral electrode portions, respectively, and also produces charges with opposite polarities in the central electrode portion.

However, with the unique and inventive arrangement of the preferred embodiments of the piezo-resonator, the peripheral electrode portions are preferably interconnected to each other to cancel the electrical charges. Also, charges with opposite polarities produced in the central portion can also be offset. Additionally, a suitable connecting method can be selected to cancel electrical charges with opposite polarities generated in the other portions of the divided electrode.

In particular, at least one of the electrodes may be divided into three portions and arranged to be substantially parallel to the central line extending along the longitudinal substrate, and the total widths of the peripheral electrode portions may be made substantially equal to the width of the central electrode portion. With this arrangement, the areas of the connected peripheral portions can be substantially the same as the area of the central portion. Further, the divided peripheral portions and the central portion may be used as two input/output terminals, and the electrode disposed on the opposite surface of the substrate may serve as a ground terminal. Thus, the capacitance between one input/output terminal and the ground terminal can be substantially equal to the capacitance between the other input/output terminal and the ground terminal. The use of the term "substantially equal" between the total widths of the peripheral portions and the width of the central portion results from working precision errors of ±20 in relation to the target value while micromachining is performed with a dicer.

Alternatively, at least one of the electrodes may be divided in such a manner that the divided three portions are substantially parallel to the central line extending along the longitudinal substrate, and the width of each of the peripheral portions is substantially equal to the width of the central portion. This arrangement eliminates the need for an extremely small-width portion. Thus, the chipping of the substrate can be prevented, and the electrode can be prevented from being removed while micromachining is performed with a dicer. The use of the term "substantially equal" between the width of each of the divided peripheral electrode portions and the width of the central portion results from working precision errors of ±20% in relation to the target value during the micromachining with a dicer.

Moreover, the provision of a conductive support member on the divided electrode makes it possible to attach the piezo-resonator on the piezoelectric substrate having pattern electrodes thereon. By virtue of this support member, the portions of the resonator other than a node of the substrate can be spaced from the substrate, which would otherwise restrict vibrations of the substrate.

In a filter using a plurality of piezo-resonators, the piezo-resonator of the preferred embodiments of the present invention can be preferably provided at least in the last stage of the plurality of resonators. Accordingly, any noise produced in the first stage of the resonator resulting from external impact can be precluded from being output from the filter because the frequency of the signal from the first stage resonator is different from the resonant frequency of the final stage resonator.

The above-described piezo-resonator or filter according to the preferred embodiments of the present invention can be used in an intermediate frequency filter provided in an AM signal receiving device. Then, the output of noise caused by external impact can be prevented, and spurious responses can be improved, thereby eliminating unwanted electric signals.

As will be clearly understood from the foregoing description, the preferred embodiments of the present invention provide the following advantages.

Even with the application of an external mechanical impact, the resulting undesired electrical charges can be offset, thereby eliminating the output of unwanted signals. Particularly when the electrode is divided into three portions in which the total widths of the peripheral portions are substantially equal to the width of the central portion, the capacitance between one input/output terminal and the ground terminal can be substantially the same as the capacitance between the other input/output terminal and the ground terminal. Accordingly, either of the two input/output terminals can be used as an input terminal or an output terminal, resulting in the resonator operating with substantially the same characteristics. Alternatively, the electrode may be divided into three portions in which the width of each of the peripheral portions may be made substantially equal to the width of the central portion. This can eliminate an extremely small-width portion, thereby preventing damage to the resonator while micromachining is performed. In this manner, the piezo-resonator can be readily and easily manufactured. Further, if a support member is employed to attach the piezo-resonator to the substrate having pattern electrodes disposed thereon, the piezo-resonator can freely vibrate, thereby achieving good characteristics.

Moreover, in a filter using a plurality of piezo-resonators, the piezo-resonator of the preferred embodiments of the present invention can be used as the final stage of the plurality of resonators. Accordingly, any noise generated in the resonator in the first stage can be prevented from being output from the filter. Further, the above-described piezo-resonator or the filter can be used in an intermediate frequency filter of an AM radio, thereby reducing width spurious responses. It is thus possible to block the output of unwanted electric signals and to reduce noise from a speaker.

The aforedescribed elements, features and advantages of the preferred embodiments of the present invention will be apparent from the following description of the preferred embodiments of the present invention taken in connection with the accompanying drawings.

DETAILED DESCRIPTION OF PREFERRED EMBODIMENTS

Figure 1:
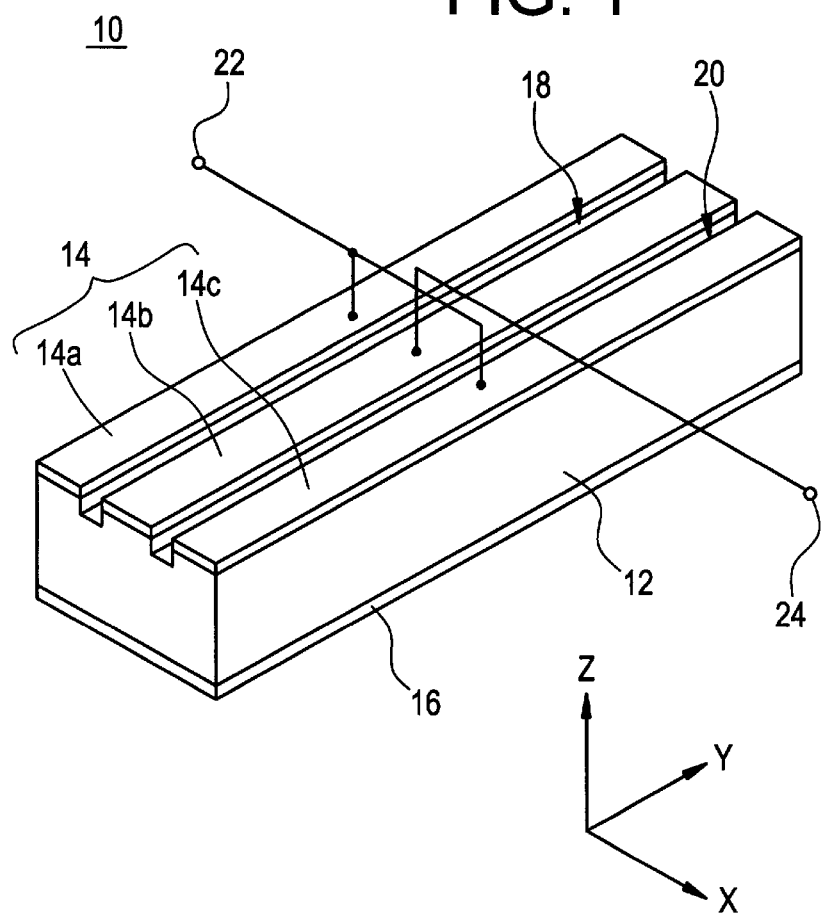
FIG. 1 is a perspective view of a piezo-resonator according to a preferred embodiment of the present invention.

Referring to FIG. 1, a piezo-resonator generally indicated by 10 includes a substantially rectangularly-formed tabular piezoelectric substrate 12. Electrodes 14 and 16 are respectively disposed on both top and bottom surfaces of the substrate 12. Two grooves 18 and 20 are formed in one electrode 14 and extend along the longitudinal substrate 12. The grooves 18 and 20 are substantially symmetrical to each other with respect to the central axis of the longitudinal substrate 12, and more particularly, in this resonator 10, the grooves 18 and 20 are substantially parallel to the central axis along the longitudinal substrate 12. The provision of these grooves 18 and 20 divides the electrode 14 into three electrode portions 14a, 14b and 14c. It should be noted that the grooves 18 and 20 are not necessarily parallel to the central axis as long as they are substantially symmetrical to each other about the central axis. It is essential only that the electrode portions 14a and 14c at the periphery of the electrode 14 be substantially symmetrical to each other with respect to the central axis.

In this resonator 10, the electrode 16 functions as a ground terminal. Moreover, there are two input/output terminals 22 and 24 in this preferred embodiment: the electrode portions 14a and 14c at the periphery of the electrode 14 are connected to each other to be used as one input/output terminal 22, while the electrode portion 14b at the center of the electrode 14 serves as the other input/output terminal 24. With this arrangement, a signal is input to the one input/output terminal 22 to produce longitudinal vibrations in the substrate 12, and a resulting signal corresponding to the resonant frequency is output from the other input/output terminal 24.

Figure 2:
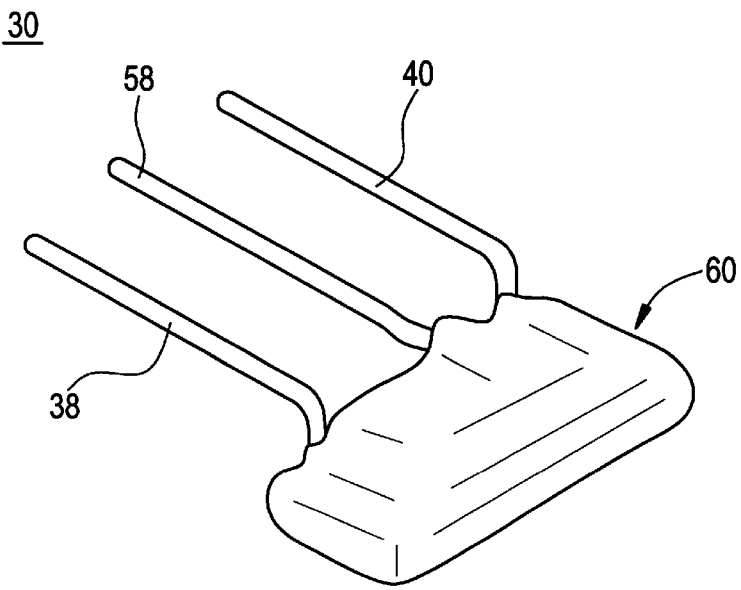
FIG. 2 is a perspective view of a three-terminal piezoelectric component including the piezo-resonator shown in FIG. 1.
Figure 3:
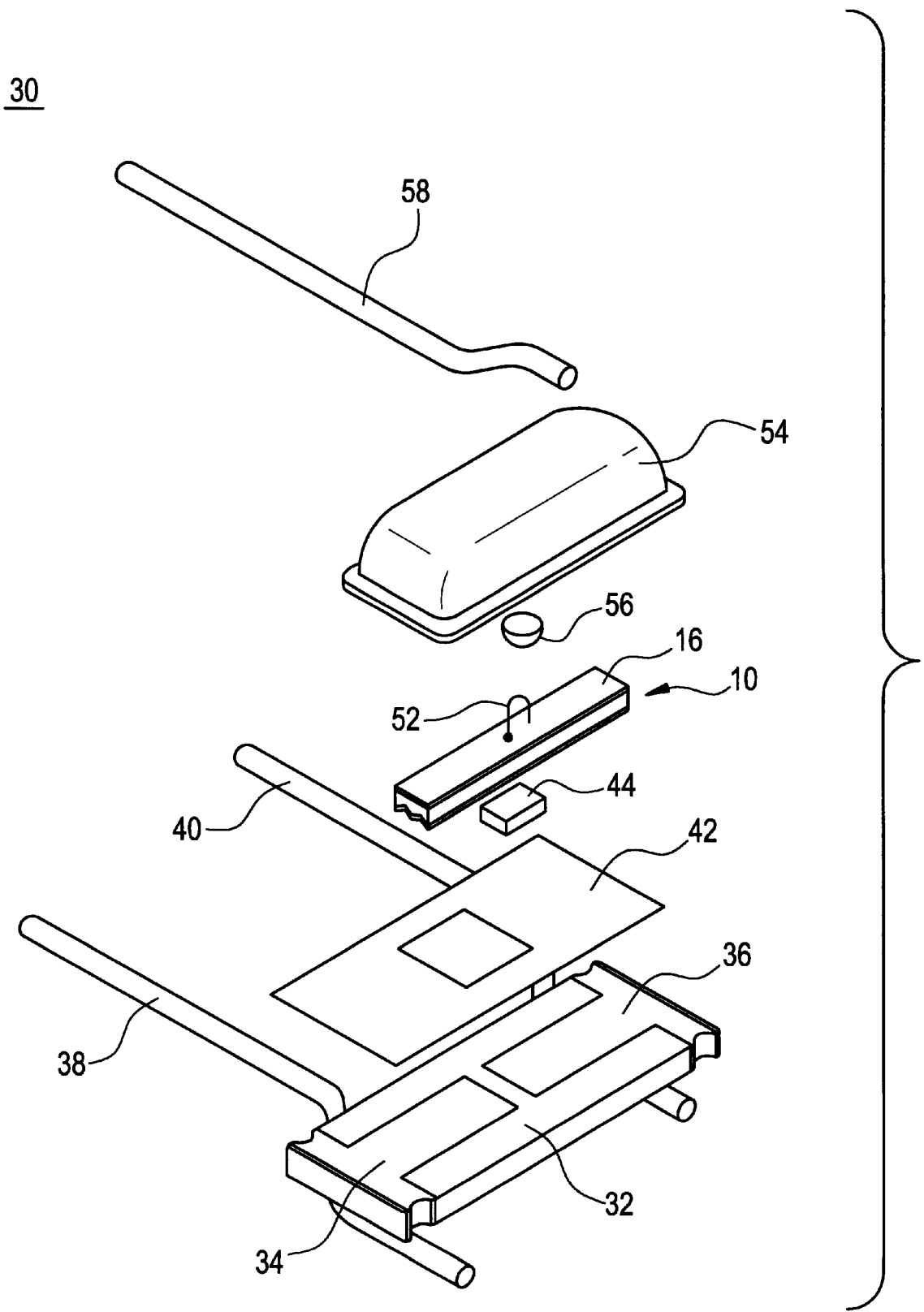
FIG. 3 is an exploded perspective view of the piezoelectric part shown in FIG. 2.

The above-described piezo-resonator 10 can be used, as shown in FIGS. 2 and 3, in a three-terminal piezoelectric component. A piezoelectric component generally indicated by 30 has an insulating substrate 32. Two pattern electrodes 34 and 36 are provided on a first surface of the substrate 32 extending from opposite ends to the center of the longitudinal substrate 32 where the electrodes 34 and 36 oppposedly face each other. The electrodes 34 and 36 are further disposed to extend from the lateral surfaces to a second surface of the substrate 32 where two input/output lead terminals 38 and 40 are connected to the pattern electrodes 34 and 36, respectively.

Figure 4:
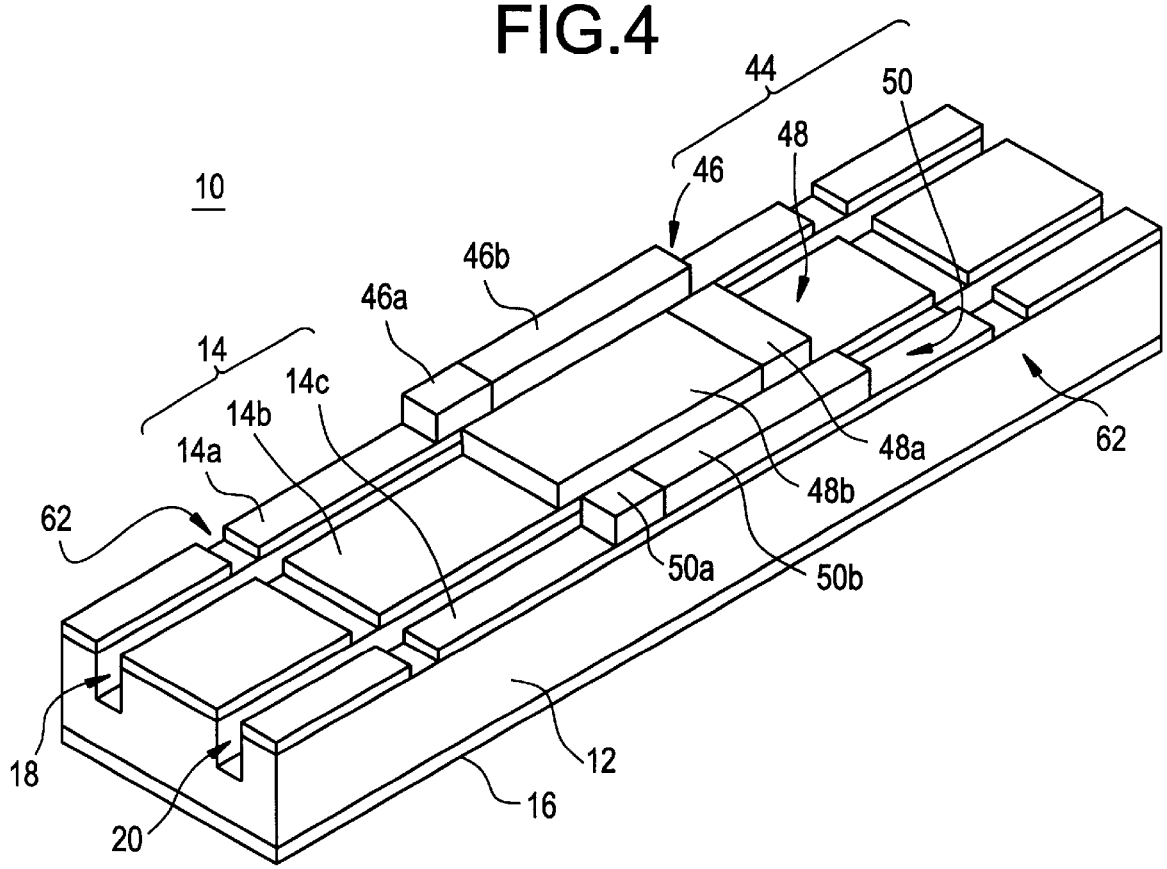
FIG. 4 is a perspective view of a piezo-resonator for use in the piezoelectric component shown in FIG. 2.

An insulating layer 42 is disposed on the first surface of the insulating substrate 32 except for the gap between the opposing pattern electrodes 34 and 36. The piezo-resonator is then mounted on the electrodes 34 and 36 through a support member 44. The support member 44 is preferably comprised of, as shown in FIG. 4, three portions 46, 48 and 50 to be attached to the electrode portions 14a, 14b and 14c, respectively, at the center of the longitudinal substrate 12. The support portions 46 and 50 fixed to the peripheral electrode portions 14a and 14c have conductive sections 46a and 50a close to first ends of the longitudinal substrate 12 and also have insulating sections 46b and 50b near second ends of the substrate 12. Conversely, the support portion 48 attached to the central electrode portion 14b has a conductive section 48a close to the second end of the longitudinal substrate 12 and an insulating section 48b in the vicinity of the first end. Accordingly, the peripheral electrode portions 14a and 14c, and the central electrode portion 14b are conducted at the different portions of the support member 44 in the longitudinal direction of the substrate 12.

By the use of the above-constructed support member 44, the peripheral electrode portions 14a and 14c are electrically connected to one pattern electrode 34, while the central electrode portion 14b is electrically connected to the other pattern electrode 36. Thus, the electrode portions 14a and 14c are electrically connected to one input/output lead terminal 38, while the portion 14b is electrically connected to the other input/output lead terminal 40.

Further, a lead 52 is attached to the central portion of the electrode 16, and a metallic cap 54 covers the piezo-resonator 10. Accordingly, the lead 52 and the cap 54 can be bonded to each other by means of a conductive paste 56. Further, a ground lead terminal 58 is attached to the cap 54, thereby establishing an electrical connection between the electrode 16 of the resonator 10 and the ground lead terminal 58. The provision of the insulating layer 42 electrically insulates the pattern electrodes 34 and 36 from the metallic cap 54. An outer sheath 60 covers the exterior of the insulating substrate 32 and the metallic cap 54. In this manner, the piezoelectric component 30 can be produced.

In the aforedescribed piezoelectric component 30, the central portion serving as a node of the resonator 10 is supported by the support member 44. Without the support member 44, the longitudinal vibrations of the piezoelectric substrate 12 would be suppressed and the component would not be able to obtain good filter characteristics achieved with the use of the support member 44. Two grooves 62 are preferably formed, as illustrated in FIG. 4, in the resonator to extend along the width of the substrate 12 and are preferably positioned at the portions equivalent to about one sixth of the overall length of the substrate 12 measured inwardly from both ends of the longitudinal substrate 12. The provision of these grooves 62 prevents the generation of the third-order higher harmonics.

Figure 5:
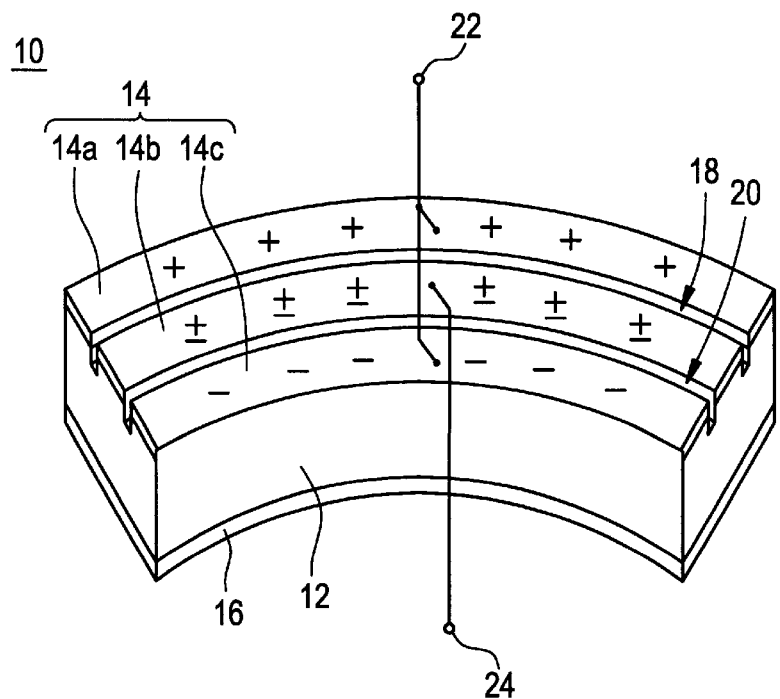
FIG. 5 illustrates the piezo-resonator shown in FIG. 1 when external impact is applied.

If there is any external impact applied to the resonator 10 of the preferred embodiment, warpage or deformation may occur in the substrate 12, as shown in FIG. 5, which disadvantageously expands one side of the substrate 12 and contracts the other side across the central line extending along the longitudinal substrate 12. This may produce positive charges in the expanded portion and negative charges in the contracted portion of the substrate 12. However, these positive and negative charges are canceled because in the resonator 10 of the preferred embodiment, the outer electrode portions 14a and 14c are connected to each other. Also, in the central electrode portion 14b, the charges with opposite polarities generated in the respective sides of the central line of the substrate 12 can be offset, which would otherwise output unwanted signals produced by external impact from the input/output terminal 22 or 24.

Figure 6:
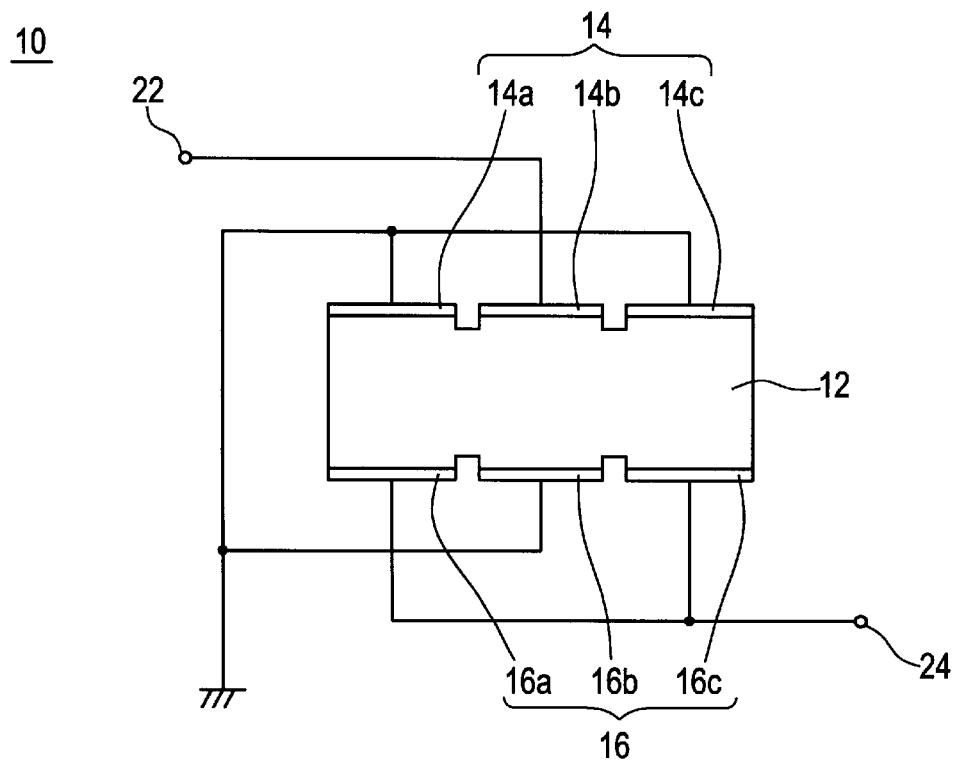
FIG. 6 is a side view of an example of modifications of the piezo-resonator shown in FIG. 1.

Alternatively, the electrodes 14 and 16 disposed on both the top and bottom surfaces of the substrate 12 may be, as illustrated in FIG. 6, divided into three electrode portions 14a, 14b, 14c, and 16a, 16b, 16c, respectively. In this additional preferred embodiment, the central electrode portion 14b of the electrode 14 may act as one input/output terminal 22, while the peripheral electrode portions 14a and 14c may be connected to the central electrode portion 16b to be used for grounding. Further, the peripheral electrode portions 16a and 16c may be coupled to each other to serve as the other input/output terminal 24. In this resonator 10, as well as the resonator shown in FIG. 1, electrical charges generated in the peripheral electrode portions 14a and 14c and in the central electrode portion 14b resulting from any warpage or deformation in the substrate 12 are offset. Similarly, electrical charges produced in the peripheral electrode portions 16a and 16c and the central electrode portion 16b are canceled. This eliminates the output of unwanted signals from the input/output terminal 22 or 24 which undesired signals are caused by impact imparted to the resonator 10.

Figure 8:
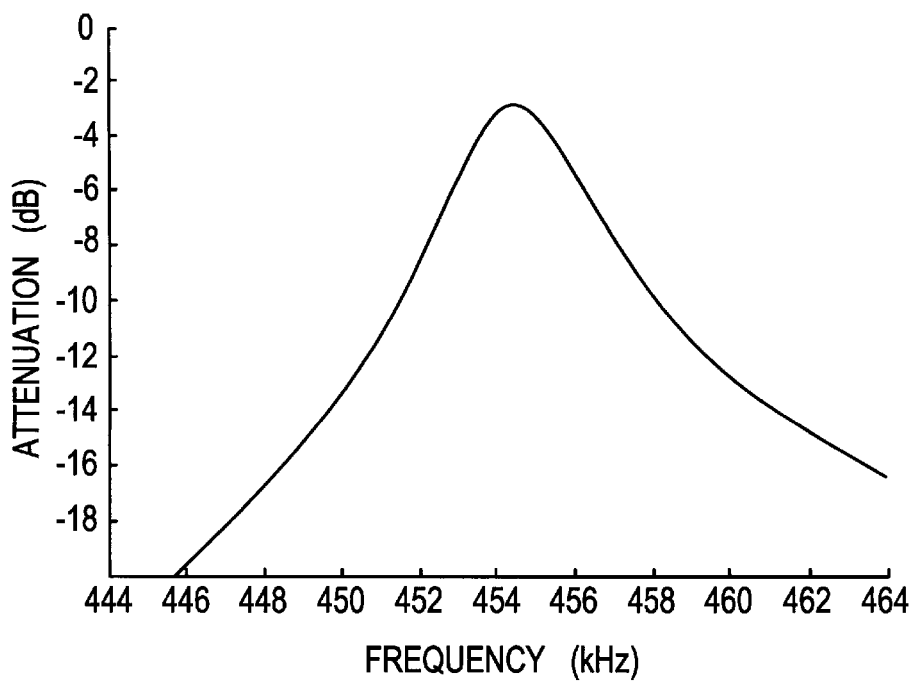
FIG. 8 is a diagram illustrating the frequency characteristics of and around the resonant frequency enlarged from the diagram shown in FIG. 7.
Figure 7:
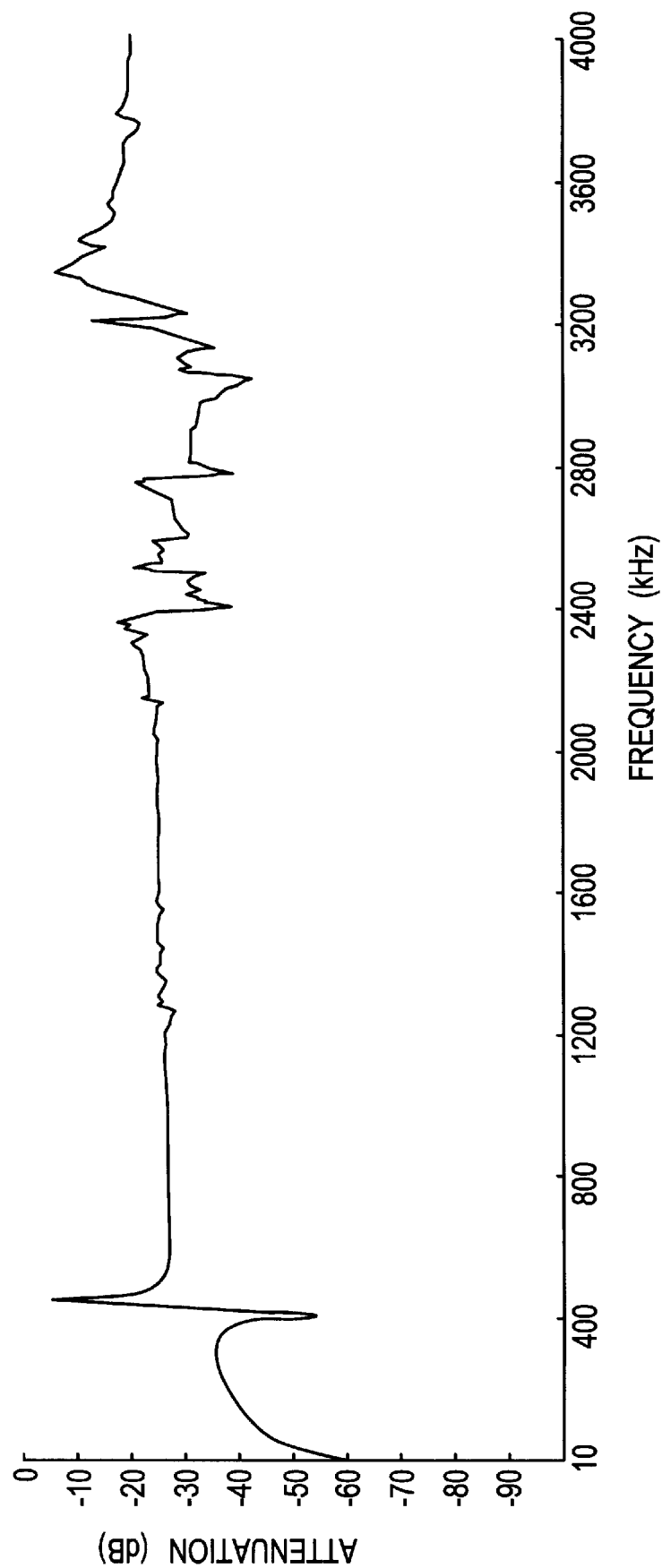
FIG. 7 is a diagram illustrating the frequency characteristics of the piezo-resonator shown in FIG. 1.
Figure 9:
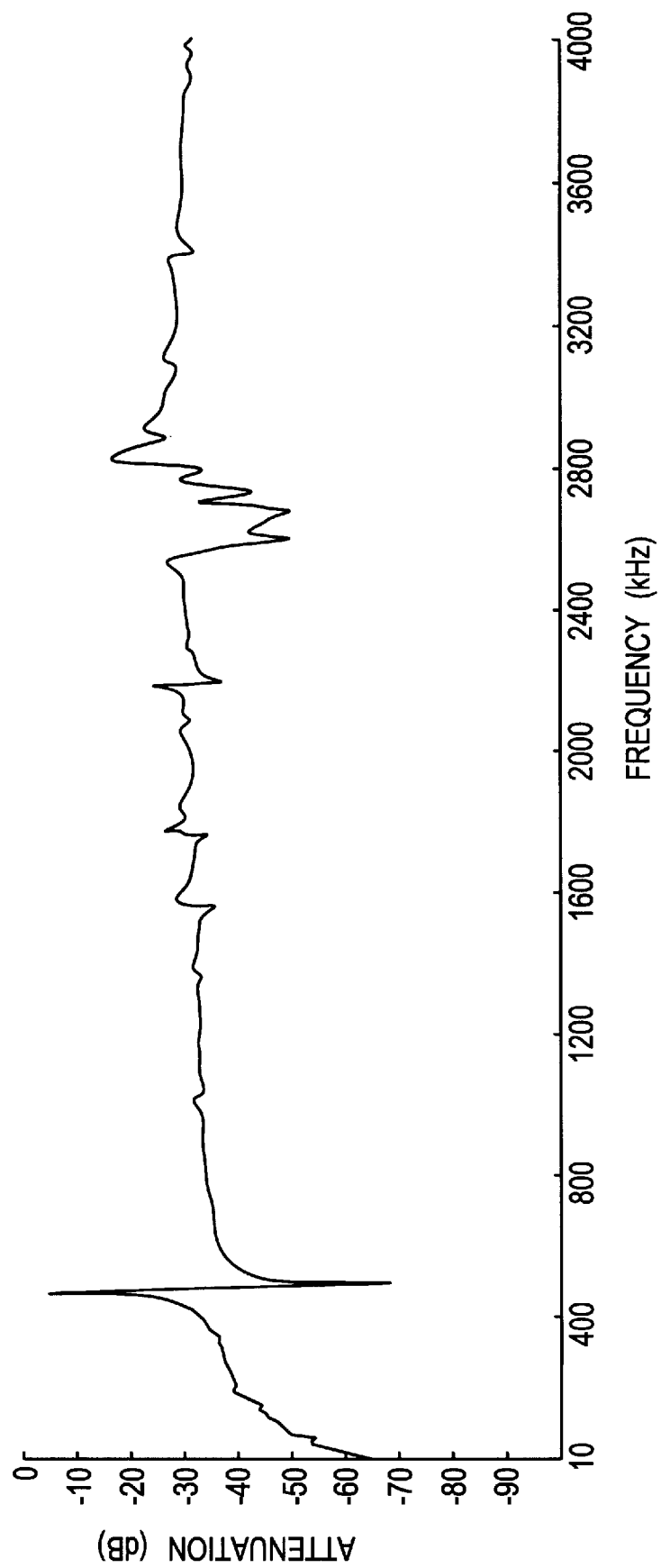
FIG. 9 is a diagram illustrating the frequency characteristics of the piezo-resonator shown in FIG. 6.
Figure 10:
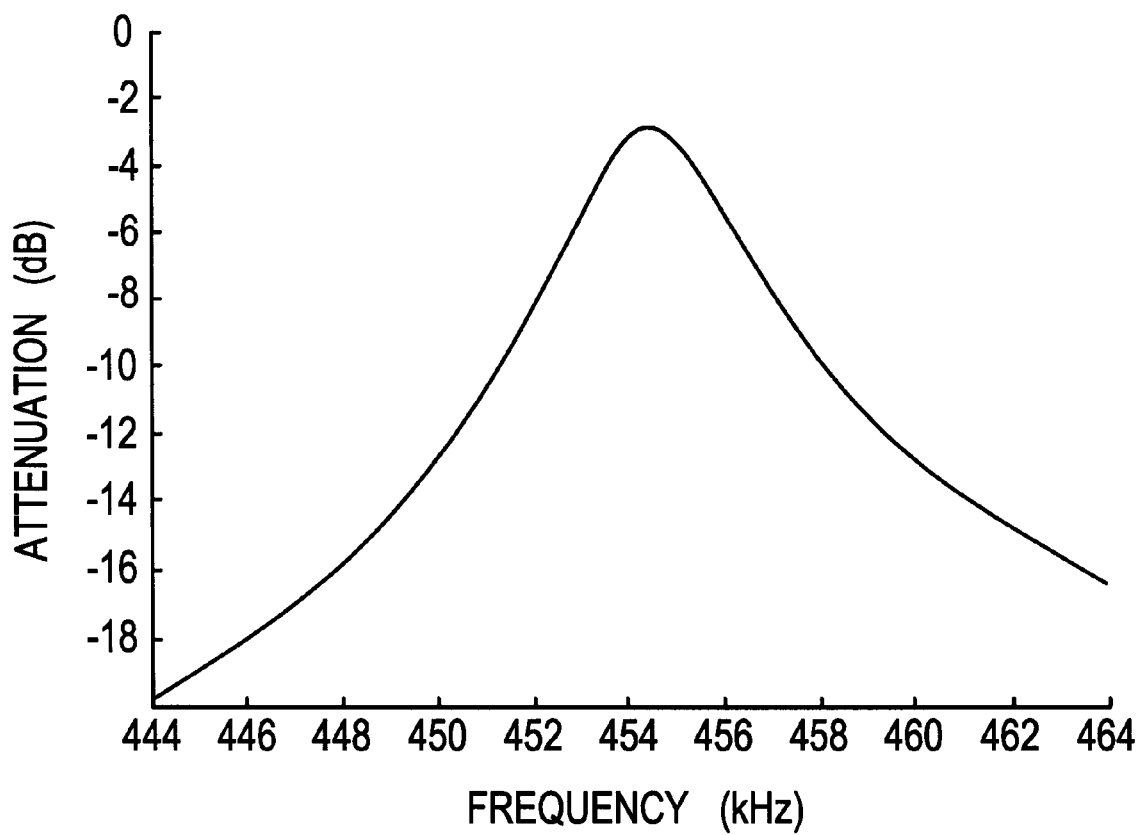
FIG. 10 is a diagram illustrating the frequency 5 characteristics of and around the resonant frequency enlarged from the diagram shown in FIG. 9.

In the piezo-resonator 10 constructed as described above, the occurrence of unwanted signals due to external impact are eliminated. Accordingly, by application of this resonator 10 to an intermediate frequency filter of an AM radio, any noise output from a speaker due to external impact is substantially reduced. Additionally, FIGS. 7, 8, 9 and 10 indicate that the magnitude of attenuation over the resonant frequency of the above type of resonator 10 is substantially equal to that of conventional piezo-resonators, and smaller spurious responses can be obtained in the resonator 10. FIGS. 7 and 8 illustrate the characteristics of the piezo-resonator 10 shown in FIG. 1, while FIGS. 9 and 10 illustrate the characteristics of the resonator 10 shown in FIG. 6. FIGS. 8 and 10 illustrate the more detailed characteristics of and around the resonant frequency enlarged from the diagrams of FIGS. 7 and 9, respectively.

An evaluation test was performed on the above piezo-resonator 10 in the following manner. A vibration of 10 G (ten times as large as gravitational acceleration) at 1 kHz was applied in three directions of the resonator 10, as indicated by the coordinates shown in FIG. 1, i.e., in the widthwise direction determined as the X direction, the longitudinal direction as the Y direction, and the thickness direction as the Z direction. The resulting signals output between the output terminal and the ground electrode were measured. The results are shown in Table 1.

TABLE 1

| Piezo-resonator | Output voltage (mV) | | |
|---|---|---|---|
| | X-direction vibration | Y-direction vibration | Z-direction vibration |
| Preferred Embodiment of the present invention | 0.7 | 0.0 | 0.3 |
| Conventional type | 10.2 | 0.9 | 1.5 |

Table 1 reveals that noise reduction can be achieved in the piezo-resonator 10 of the preferred embodiments of the present invention over the known type of resonator. In particular, a vibration applied in the X direction causes only minimal noise of 0.7 mV in the resonator 10 in contrast to noise of 10.2 mV occurring in the conventional resonator. In this manner, according to the preferred embodiments of the present invention, the impact-resistant low-noise piezo-resonator 10 can be implemented.

In the piezo-resonator 10 shown in FIG. 1, if the total widths of the peripheral electrode portions 14a and 14c are made substantially equal to the width of the central electrode portion 14b, the total areas of the electrode portions 14a and 14c can be substantially equal to the area of the electrode portion 14b. As noted above, the peripheral portions 14a and 14c are interconnected to each other to be used as one input/output terminal 22, while the central portion 14b functions as the other input/output terminal 24. Accordingly, the capacitance between the input/output terminal 22 and the electrode 16 can be substantially the same as the capacitance between the input/output terminal 24 and the electrode 16. This can ensure that either of the input/output terminal 22 or 24 may be used as an input terminal or an output terminal, resulting in the resonator 10 having substantially the same characteristics despite different connections of the terminals 22, 24. Thus, when the resonator 10 is provided in, for example, the piezoelectric component 30 illustrated in FIG. 2, it is not necessary to determine which input/output terminal 38 or 40 be used as an input terminal or an output terminal.

Alternatively, the width of each of the peripheral electrode portions 14a and 14c may be made substantially equal to the width of the central electrode portion 14b, thereby eliminating the presence of an extremely small-width portion. This can prevent the chipping of the piezoelectric substrate 12, and also, the electrode 14 can be prevented from being removed while micromachining is performed with a dicer. Therefore, the piezo-resonator 10 can be easily manufactured while being protected from damage during machining.

Figure 11:
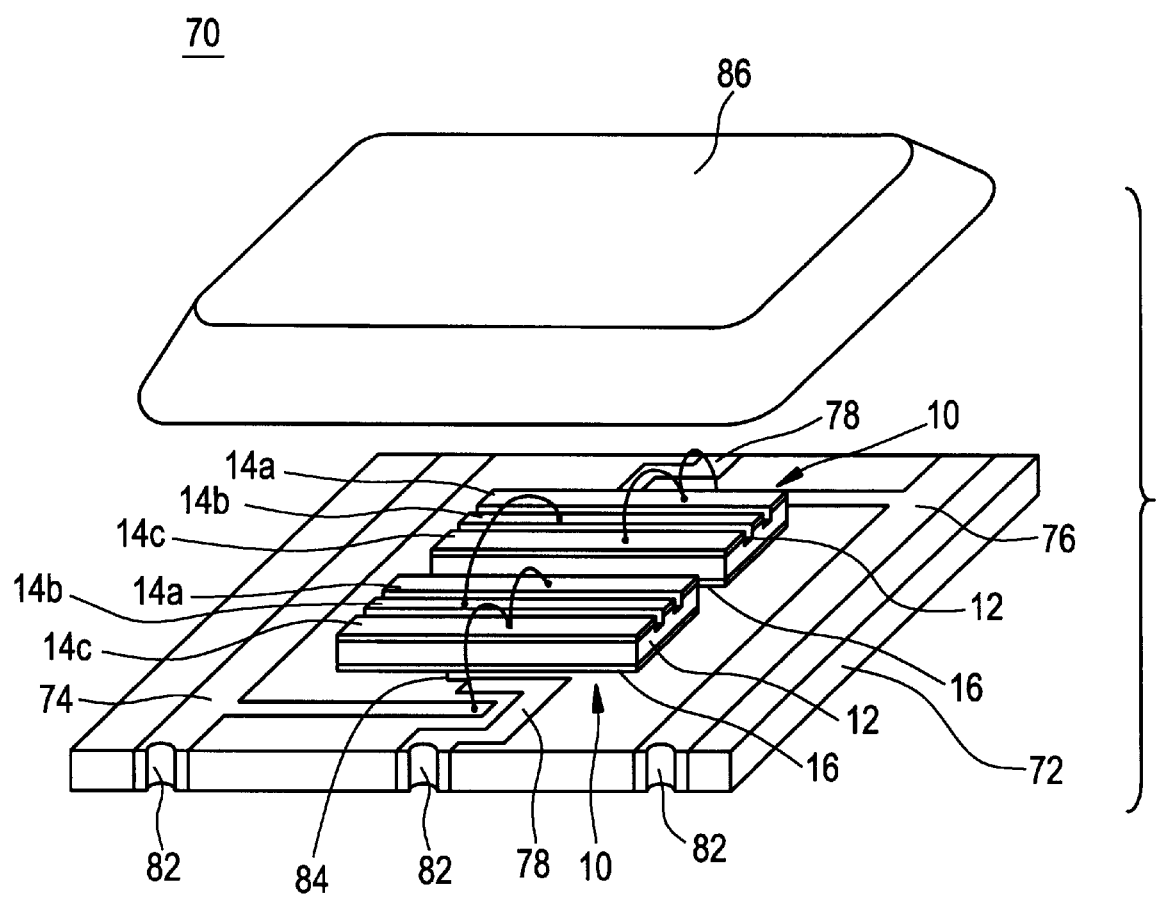
FIG. 11 is a perspective view of a filter using two piezo-resonators shown in FIG. 1 according to a preferred embodiment of the present invention.

To further develop the present invention, as shown in FIG. 11, a filter can be produced by the use of two resonators 10. A filter generally designated by 70 includes, for example, an insulating substrate 72. Disposed on the insulating substrate 72 are an input pattern electrode 74, an output pattern electrode 76, and a ground pattern electrode 78. The input and output pattern electrodes 74 and 76 are arranged substantially parallel to each other near both sides of the substrate 72. The ground pattern electrode 78 is disposed between the input and output pattern electrodes 74 and 76. All of the electrodes 74, 76 and 78 preferably extend from one side of the substrate 72 to the opposite side. Further, external terminals 82 for connection with external circuits are disposed on a lateral surface of the substrate 72, and the above-described electrodes 74, 76 and 78 are connected to these terminals 82, respectively.

Two piezo-resonators 10 are located on the ground pattern electrode 78, and the electrode 16 of the resonator 10 is bonded to the ground pattern electrode 78 by a connecting member such as a conductive adhesive 84. Moreover, the peripheral electrode portions 14a and 14c of one resonator 10 are connected to the input pattern electrode 74 preferably by a lead, while the peripheral electrode portions 14a and 14c of the other resonator 10 are connected to the output pattern electrode 76 preferably by a lead. Further, the central electrode portions 14b of the respective resonators 10 are coupled to each other preferably via a lead. A metallic cap 86 covers the resonators 10.

In the filter 70 having two stages of resonators 10 as noted above, as well as in the single resonator 10, the output of unwanted signals due to external impact is prevented because of the action similar to that achieved by the resonator 10 as described above.

Figure 12:
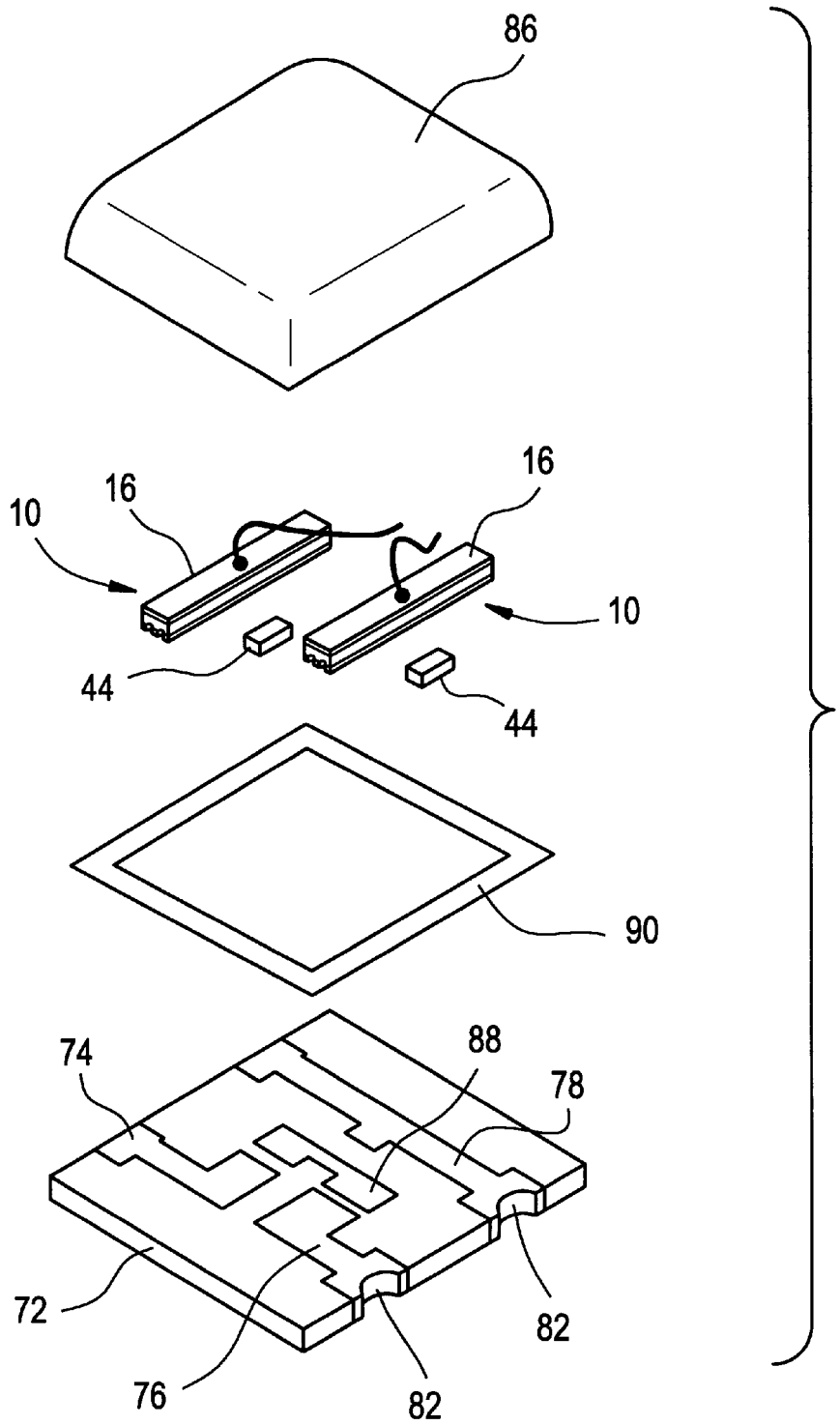
FIG. 12 is an exploded perspective view of a filter using two piezo-resonators shown in FIG. 1 according to another preferred embodiment of the present invention.

Alternatively, the support member 44 shown in FIG. 4 may be used so that the piezo-resonators 10 can be mounted on the insulating substrate 72. In this case, the input and output pattern electrodes 74 and 76 are formed, as illustrated in FIG. 12, to extend from both edges to the center of the substrate 72. Further, a common electrode 88 is disposed to opposedly face the input and output pattern electrodes 74 and 76. The ground pattern electrode 78 is formed from one edge to its opposing edge of the substrate 72.

Then, one piezo-resonator 10 is mounted between the input pattern electrode 74 and the common electrode 88 via a support member 44, while another piezo-resonator 10 is fixed between the output pattern electrode 76 and the common electrode 88 via another support member 44. This can connect the central electrode portions 14b of the two resonators 10 through the common electrode 88 and also connect the peripheral electrode portions 14a and 14c of the resonators 10 to the input and output pattern electrodes 74 and 76, respectively. Moreover, the electrodes 16 of the respective resonators 10 are connected to the ground pattern electrode 78 by the use of a lead. The metallic cap 86 covers the substrate 72 across an insulating layer 90. In the above-described filter 70, the central portions serving as nodes, of the resonators 10 can be supported by the support member 44, while the other portions of the resonators 10 are spaced from the substrate 72, which would otherwise interfere with longitudinal vibrations of the resonators 10, thereby achieving good filter characteristics.

Figure 13:
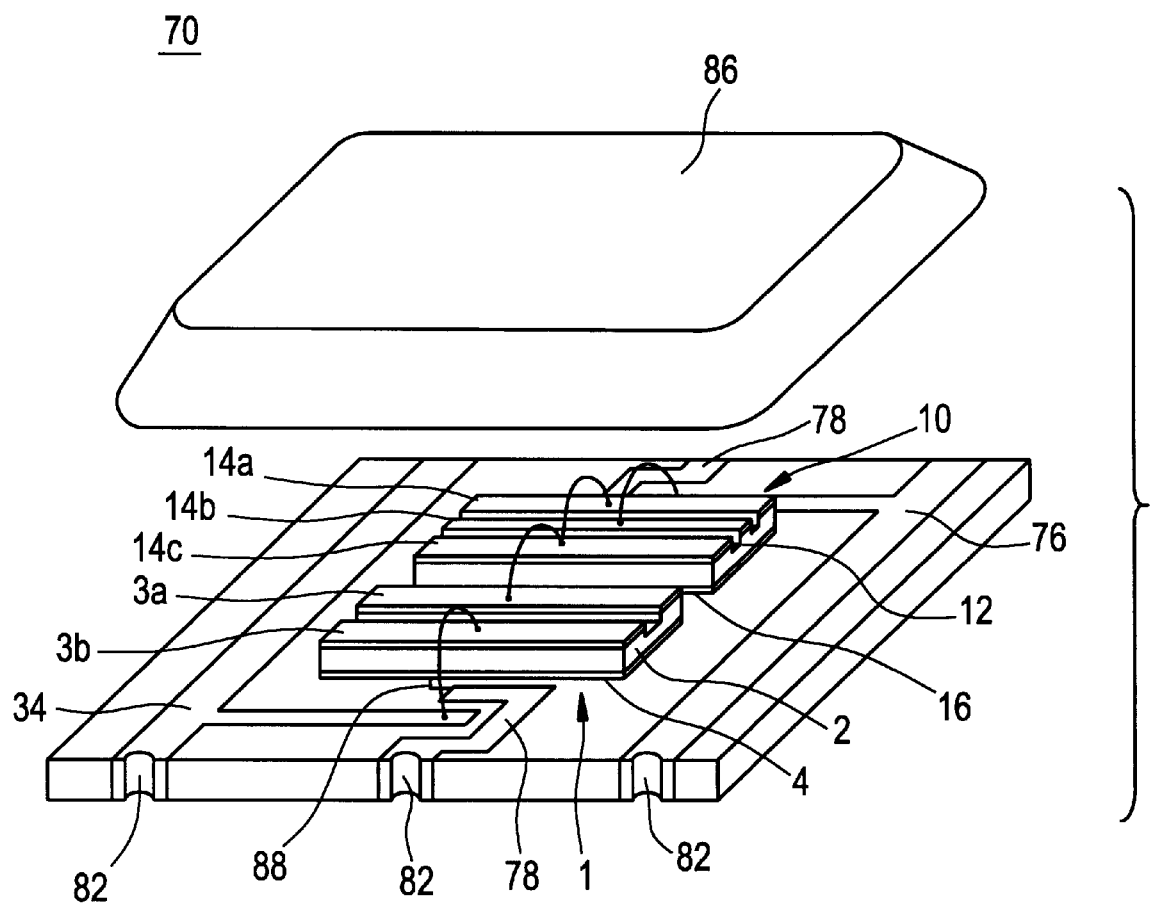
FIG. 13 is a perspective view of a filter using the piezo-resonator shown in FIG. 1 in the final stage.

The aforedescribed filter 70 may be modified, as illustrated in FIG. 13, such that the conventional piezo-resonator 1 may be used in the first stage, and the resonator 10 of the preferred embodiments of the present invention may be provided only in the final stage. In this type of filter 70, even though an unwanted signal caused by external impact is output from the resonator 1 of the first stage, the undesired signal is prevented from being output from the output pattern electrode 76 because such a signal has a resonant frequency different from that of the resonator 10 of the last stage. Hence, by the use of the piezo-resonator 10 of the preferred embodiments of the present invention, it is possible to implement a filter in which the output of unwanted signals can be eliminated even with the application of external impact to the filter.

Figure 14:
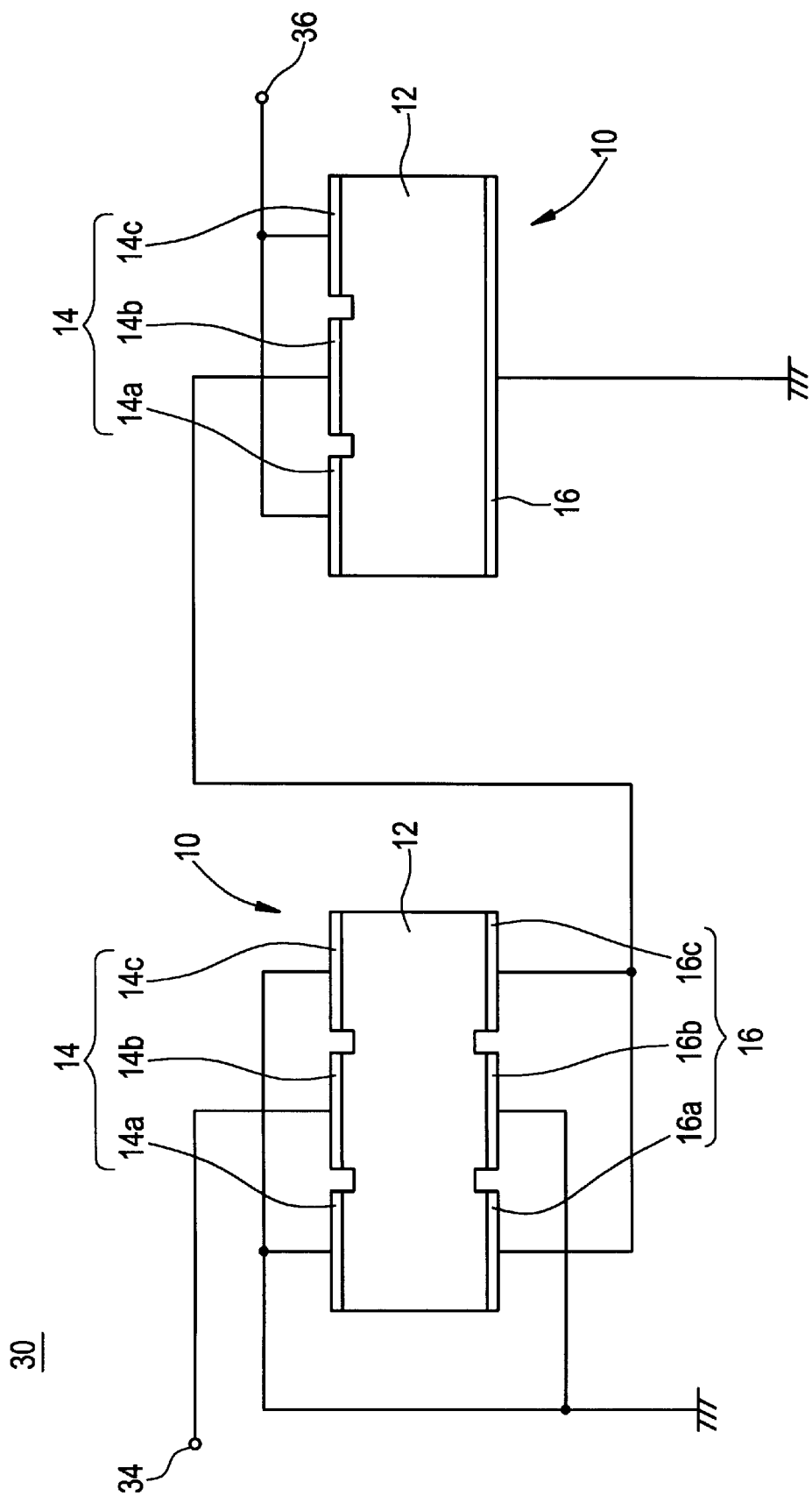
FIG. 14 illustrates a filter using the piezo-resonator shown in FIG. 6 in the first stage and the piezo-resonator shown in FIG. 1 in the final stage.

Alternatively, the filter 70 may be modified, as illustrated in FIG. 14, in the following manner. The piezo-resonator 10 having divided electrode portions on both the top and bottom surfaces of the substrate 12 may be used in the first stage, and the resonator 10 having divided electrode portions on only one of the surfaces of the substrate 12 may be used in the final stage. In this type of filter 70, as well as the previously-described filters, electrical charges produced due to external impact can be offset, thereby precluding the output of unwanted signals. It should be noted that the two types of resonators 10 shown in FIG. 14 may simply be swapped between the first and last stages.

Figure 15:
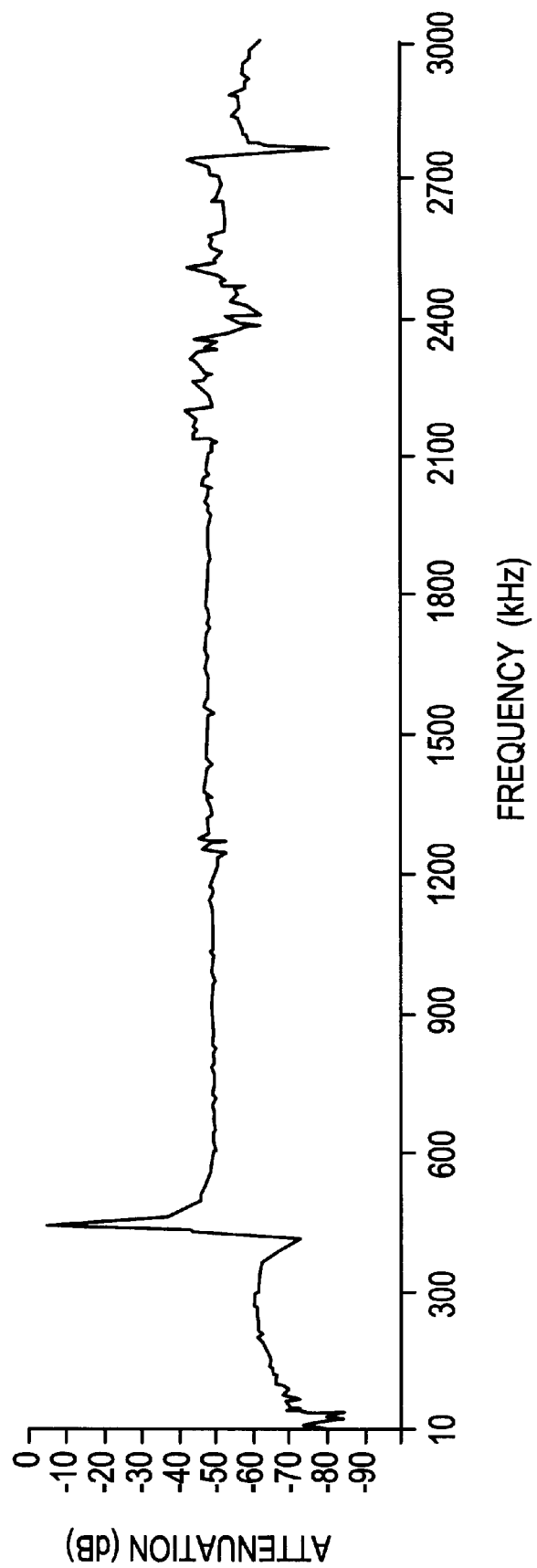
FIG. 15 is a diagram illustrating the frequency characteristics of the filter shown in FIG. 11.
Figure 16:
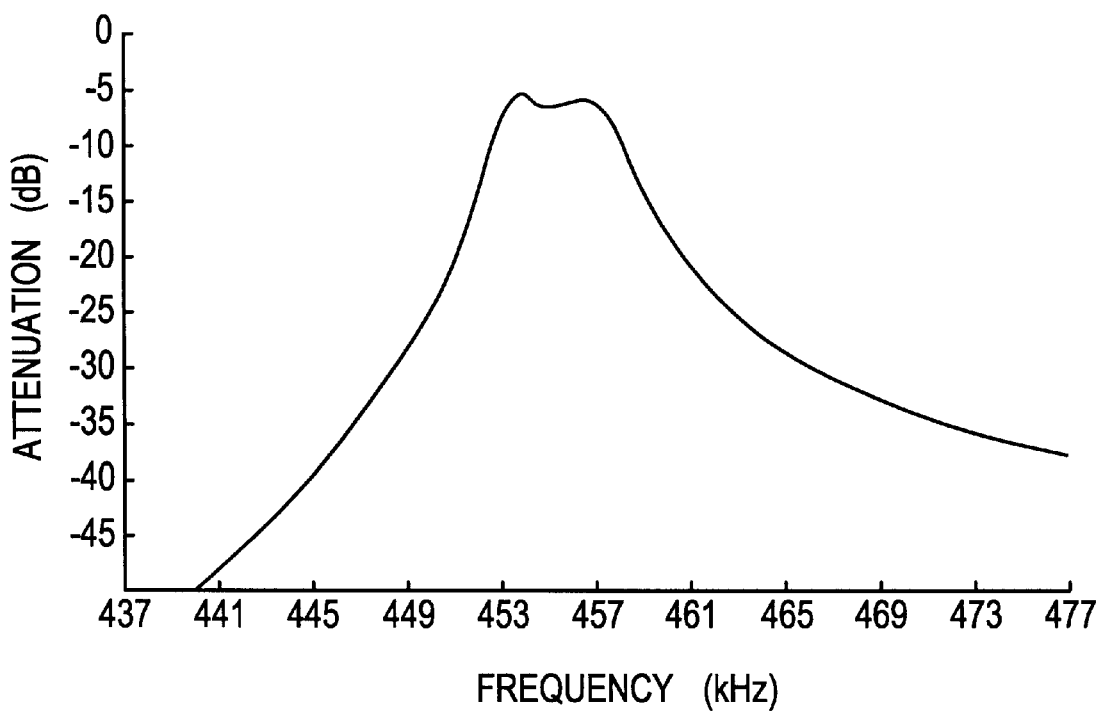
FIG. 16 is a diagram illustrating the frequency characteristics of and around the resonant frequency enlarged from the diagram of FIG. 15.
Figure 17:
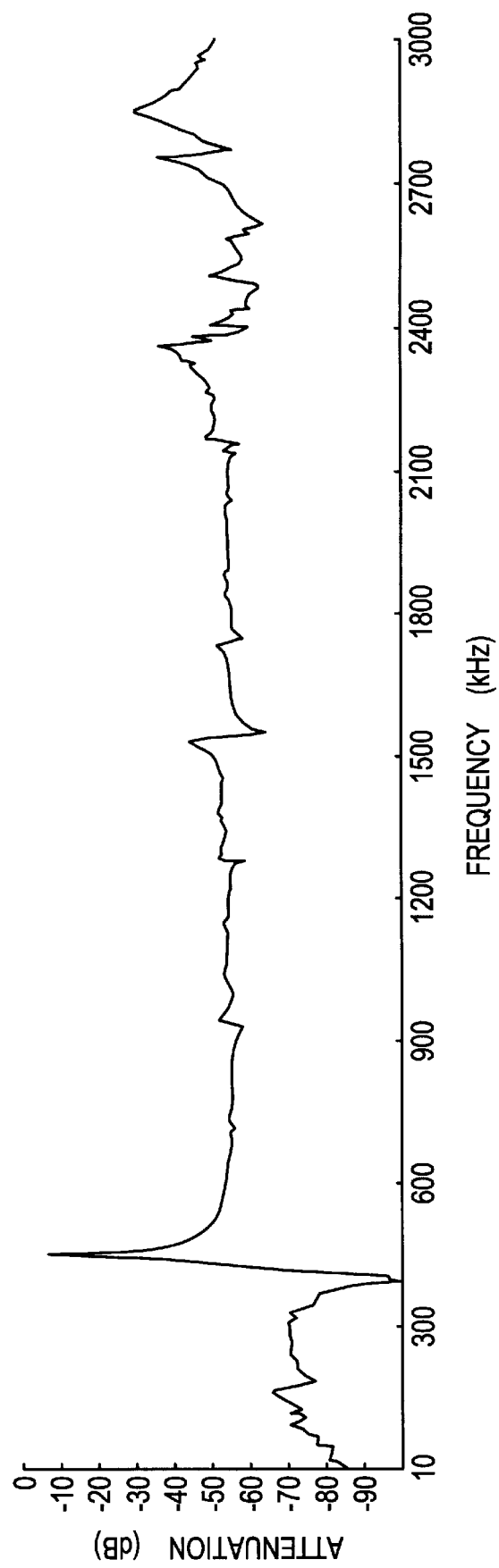
FIG. 17 is a diagram illustrating the frequency characteristics of the filter shown in FIG. 13.
Figure 18:
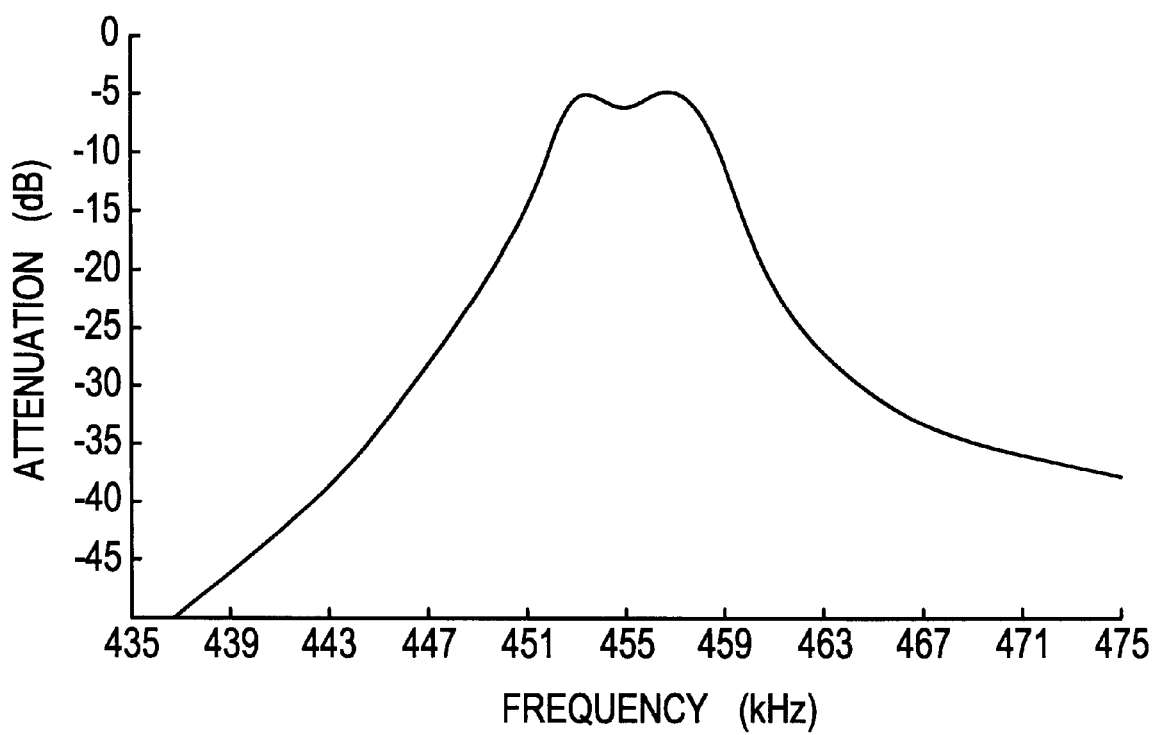
FIG. 18 is a diagram illustrating the frequency characteristics of and around the resonant frequency enlarged from the diagram of FIG. 17.
Figure 19:
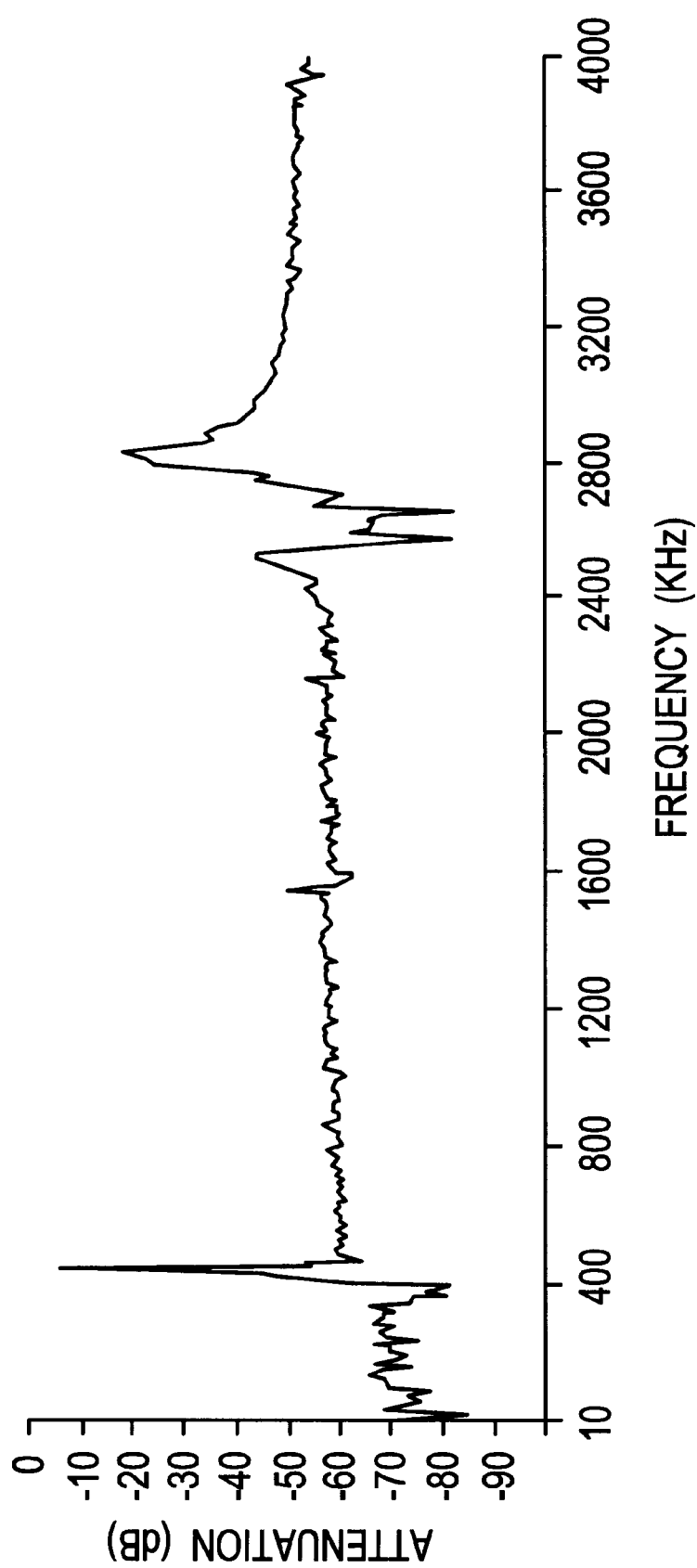
FIG. 19 is a diagram illustrating the frequency characteristics of the filter shown in FIG. 14.
Figure 20:
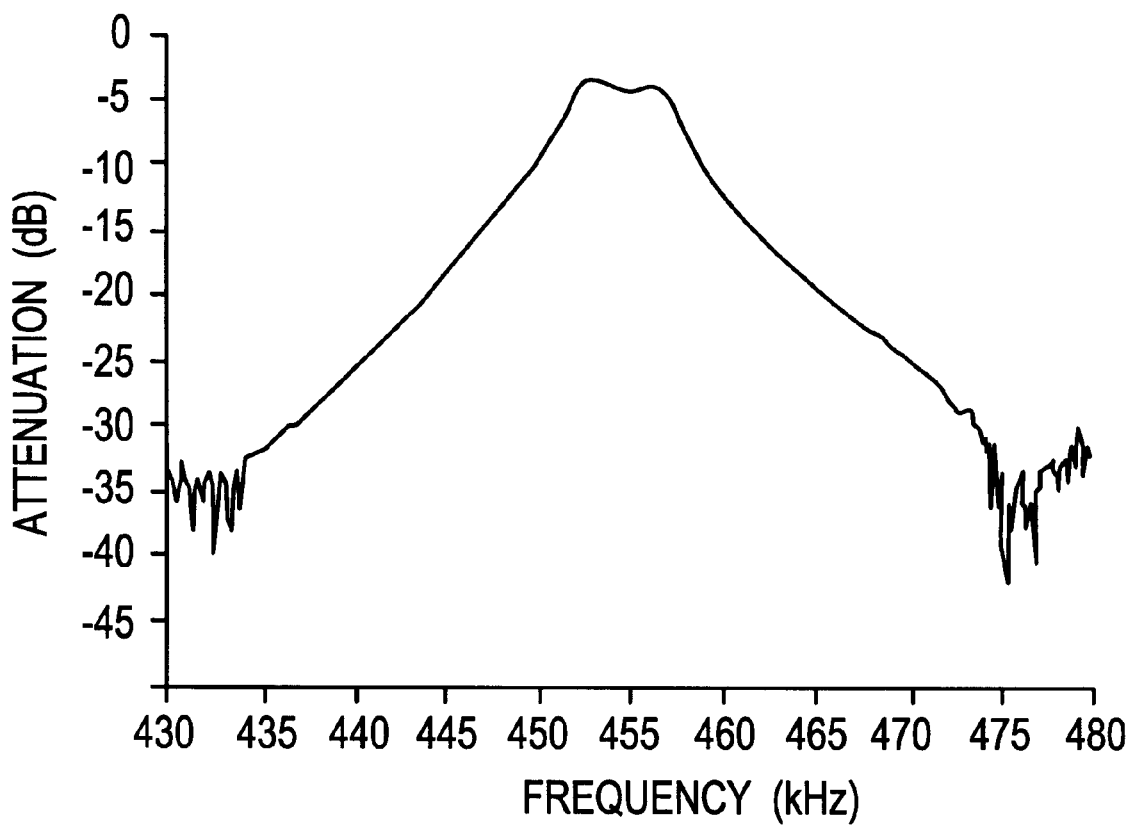
FIG. 20 is a diagram illustrating the frequency characteristics of and around the resonant frequency enlarged from the diagram of FIG. 19.
Figure 21:
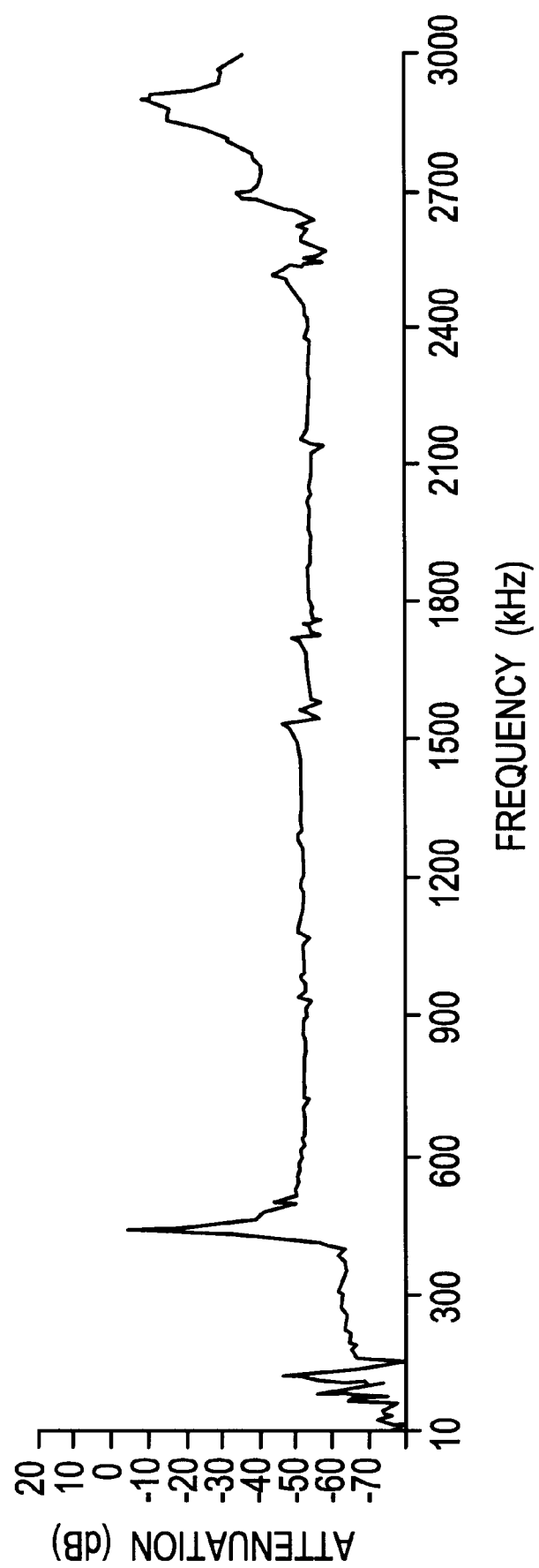
FIG. 21 is a diagram illustrating the frequency characteristics of a filter using two interconnected conventional piezo-resonators.
Figure 22:
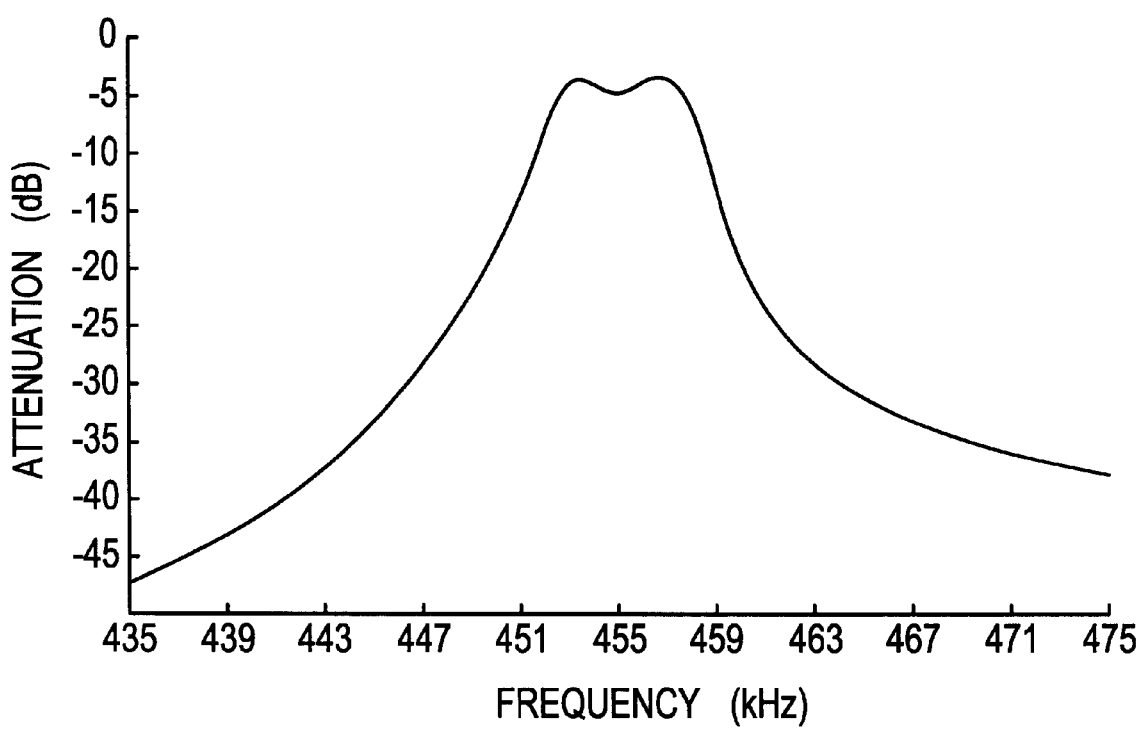
FIG. 22 is a diagram illustrating the frequency characteristics of and around the resonant frequency enlarged from the diagram of FIG. 21.

For comparing the characteristics of the aforedescribed filters 70, frequency characteristics were measured. The frequency characteristics of the aforedescribed filter 70 provided with the two interconnected resonators 10 are shown in FIGS. 15 and 16. FIGS. 17 and 18 illustrate the frequency characteristics of the filter 70 in which the resonator 1 is provided at the input terminal and the resonator 10 of the preferred embodiments of the present invention is used at the output terminal. Further, FIGS. 19 and 20 illustrate the frequency characteristics of the filter 70 in which the resonator 10 having divided electrode portions on both the top and bottom surfaces of the substrate is used at the input terminal, and the resonator 10 having divided electrode portions only on one surface of the substrate is provided at the output terminal. Additionally, the characteristics of a filter using two conventional types of interconnected resonators are shown in FIGS. 21 and 22. These figures indicate that the characteristics of the respective filters are substantially comparable.

A vibration was applied to the above-described filters for evaluation. A signal with a maximum of 10.2 mV was output from the filter using two conventional resonators, while a signal with a maximum of only 0.7 mV was output from the filter using at least one resonator 10 according to the preferred embodiments of the present invention. This test reveals that an external-impact-resistant filter can be implemented by the use of the piezo-resonator of the preferred embodiments of the present invention.

In particular, by the use of the piezo-resonator 10 having divided electrodes 14 and 16 on both the surfaces, as shown in FIG. 14, attenuation poles are generated on both sides of the resonant frequency shown in the diagram of FIG. 20, thereby achieving ideal filter characteristics.

Figure 23:
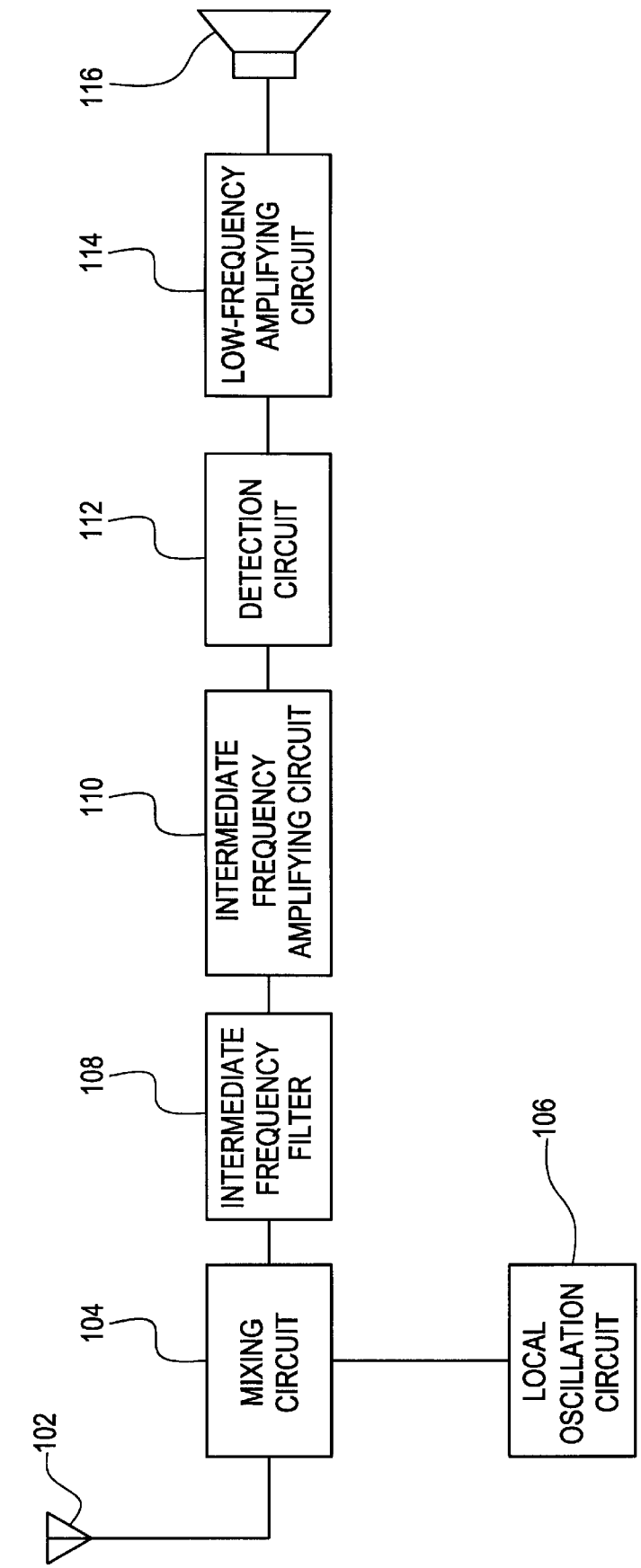
FIG. 23 is a block diagram illustrating an AM signal receiving device in which the piezo-resonator or the filter of preferred embodiments of the present invention is used as an intermediate frequency filter.

To still further develop preferred embodiments of the present invention, the aforedescribed piezo-resistor 10 or the filter 70 may be, as shown in FIG. 23, provided in an AM signal receiving device. An AM signal receiving device 100 has an antenna 102. The antenna 102 is connected to a mixing circuit 104, which is further connected to a local oscillation circuit 106. In the mixing circuit 104, a received signal is mixed with a signal from the local oscillation circuit 106. The mixing circuit 104 is coupled to an intermediate frequency filter 108. The intermediate frequency filter 108 is connected to an intermediate-frequency amplifying circuit 110, which is further coupled to a detection circuit 112. The detection circuit 112 is connected to a low-frequency amplifying circuit 114 whose output signal drives a speaker 116. The above-described piezo-resonator 10 or the filter 70 can be used in the intermediate frequency filter 108 of the AM receiving circuitry 100.

As noted above, in the mixing circuit 104, a received signal is mixed with a signal from the local oscillation circuit 106, thus producing an intermediate frequency signal having a frequency difference between the received signal and the locally generated signal in the local oscillation circuit 106. Only the intermediate frequency signal is then extracted by the intermediate frequency filter 108. In one example, the frequency of this signal is determined at 455 kHz in Japan. The intermediate frequency signal, which contains the modulated signal substantially representing the received radio waves, can be detected by the detection circuit 112 so as to extract the modulated signal. The low-frequency emodulated signal is output from the detection circuit 112 and is then amplified in the low-frequency amplifying circuit 114. The output signal from the circuit 114 drives the speaker 116, causing it to produce sound.

In the intermediate frequency filter 108 of the AM signal receiving device 100 constructed as described above, the piezo-resonator 10 or the filter 70 of the preferred embodiments of the present invention described above is used to eliminate the output of unwanted signals which would be produced due to external impact and also inhibit width spurious responses. Thus, unwanted electric signals can be blocked from being output from this device 100, thereby reducing noise which is output from the speaker 116.

In the above-described piezo-resonator 10, any dividing method for the electrode 14 may be used as long as it results in electrical charges with opposite polarities generated in the peripheral portions 14a and 14c and electrical charges produced in the central portion 14b being canceled. Thus to achieve this desired result, the areas of the peripheral portions 14a and 14c should be substantially equal to each other and the central portion 14b should have substantially the same areas as the portions 14a and 14c such that opposite polarities can be generated. This requires that the electrode 14 be divided into portions which are substantially symmetrical to each other with respect to the central axis of the substrate 12, though it is not essential that the divided portions be parallel to each other. Additionally, the electrode 14 may not necessarily be grooved in order to be divided, and instead, an electrode may be first formed on the entire surface of the tabular substrate 12, and then, only the electrode 14 or 16 may be produced by means such as etching.

Figure 24:
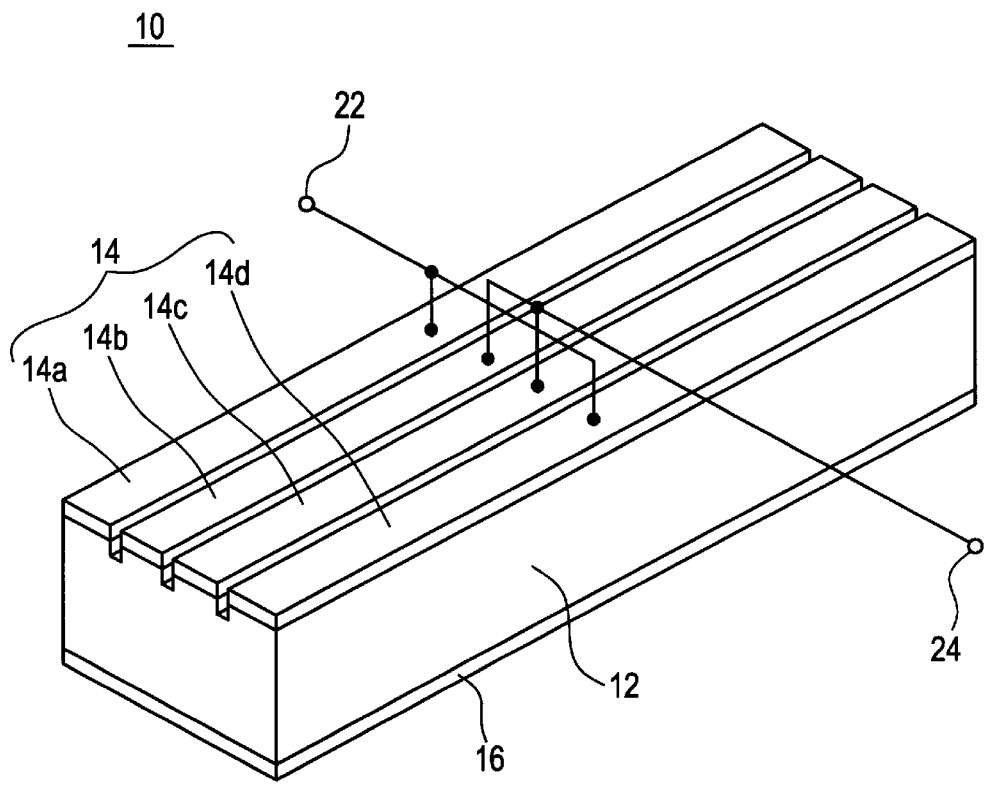
FIG. 24 is a perspective view of a piezo-resonator having four divided electrode portions.

Further, the electrodes 14 and 16 may be divided into more than three portions, for example, four or five portions. If the electrode 14 is divided, as illustrated in FIG. 24, into four portions 14a through 14d, the peripheral electrode portions 14a and 14d may be connected to be used as one input/output terminal 22, while the inner electrode portions 14b and 14c may be coupled to serve as the other input/output terminal 24. In this case, it is essential only that the peripheral portions 14a and 14d be substantially symmetrical to each other with respect to the central line extending along the longitudinal piezoelectric substrate 12, and the inner portions 14b and 14c are not necessarily formed to be symmetrical to each other relative to the central line. These portions 14b and 14c can be coupled to each other so as to cancel electrical charges with opposite polarities generated due to external impact.

Figure 25:
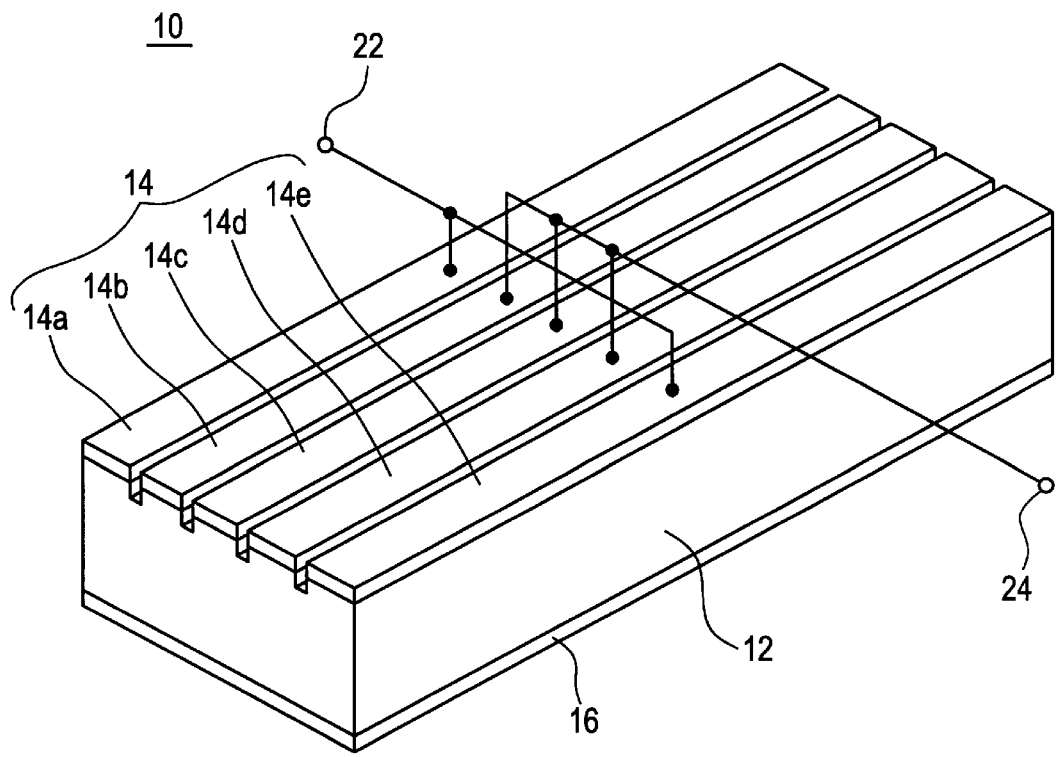
FIG. 25 is a perspective view of a piezo-resonator having five divided electrode portions.

Further, the electrode 14 may be divided, as shown in FIG. 25, into five portions 14a through 14e. In this modification, the peripheral portions 14a and 14e may be connected to be used as one input/output terminal 22, while the three inner portions 14b, 14c and 14d may be connected to function as the other input/output terminal 24. In this case, it is essential merely that the peripheral portions 14a and 14e be substantially symmetrical to each other with respect to the central line extending along the longitudinal substrate 12, and it is not necessary that the inner portions 14b, 14c and 14d be symmetrical to each other about the central line. The connection of the portions 14b, 14c and 14d can offset electrical charges with opposite polarities produced due to external impact.

Figure 26:
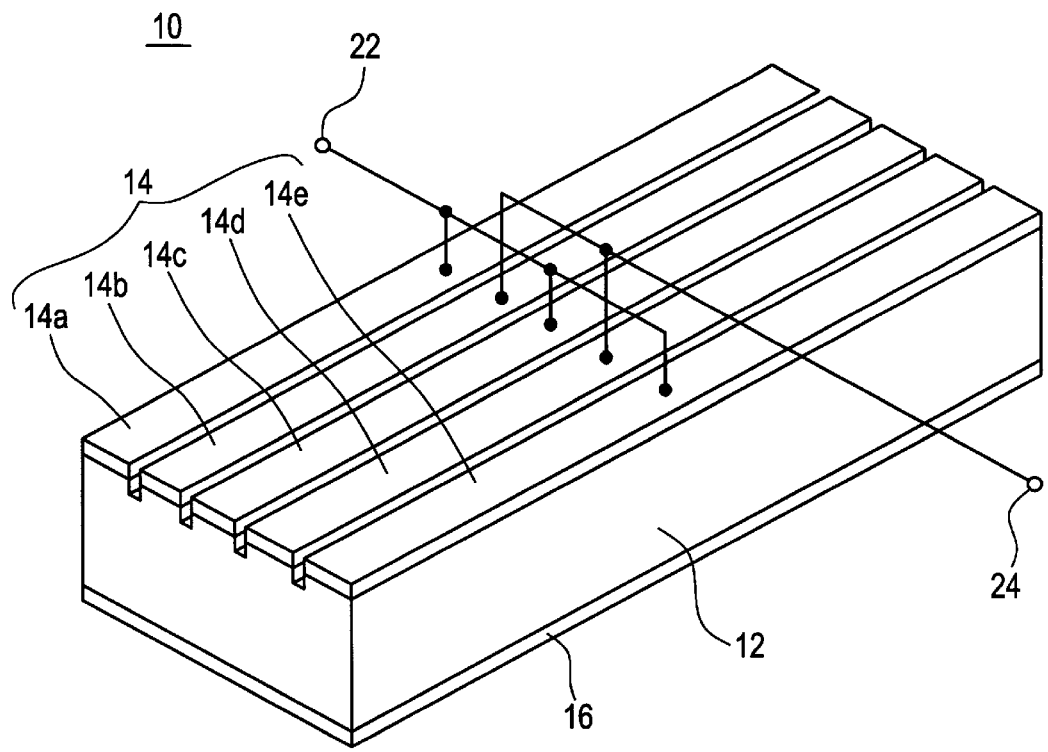
FIG. 26 is a perspective view of a modification of the connecting method employed for the piezo-resonator shown in FIG. 25.
Figure 27:
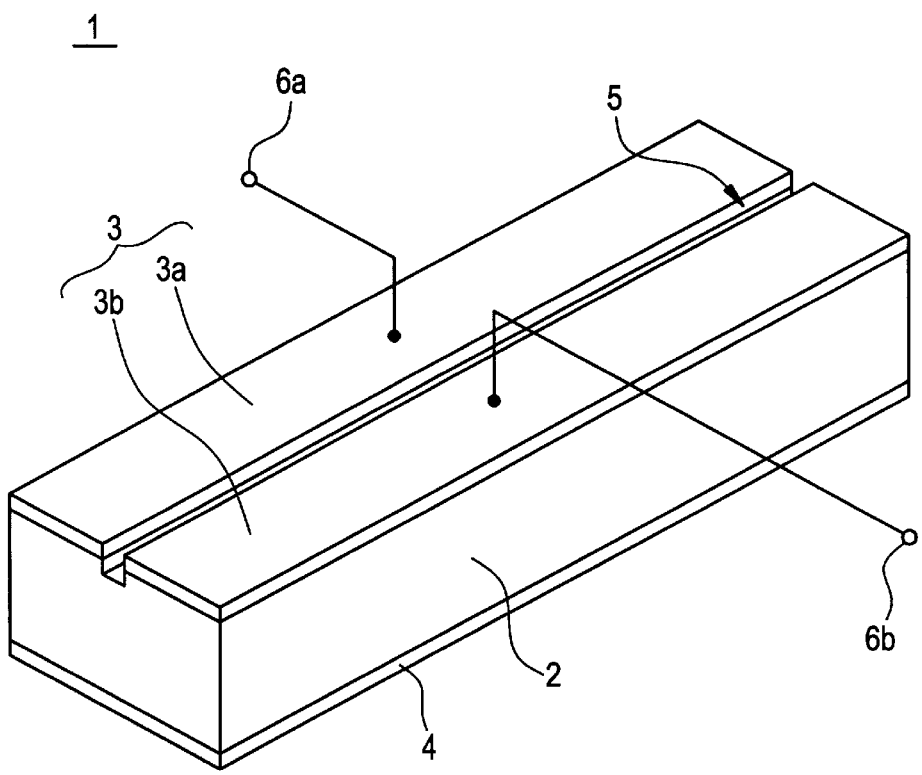
FIG. 27 is a perspective view illustrating an example of a conventional piezo-resonator.
Figure 28:
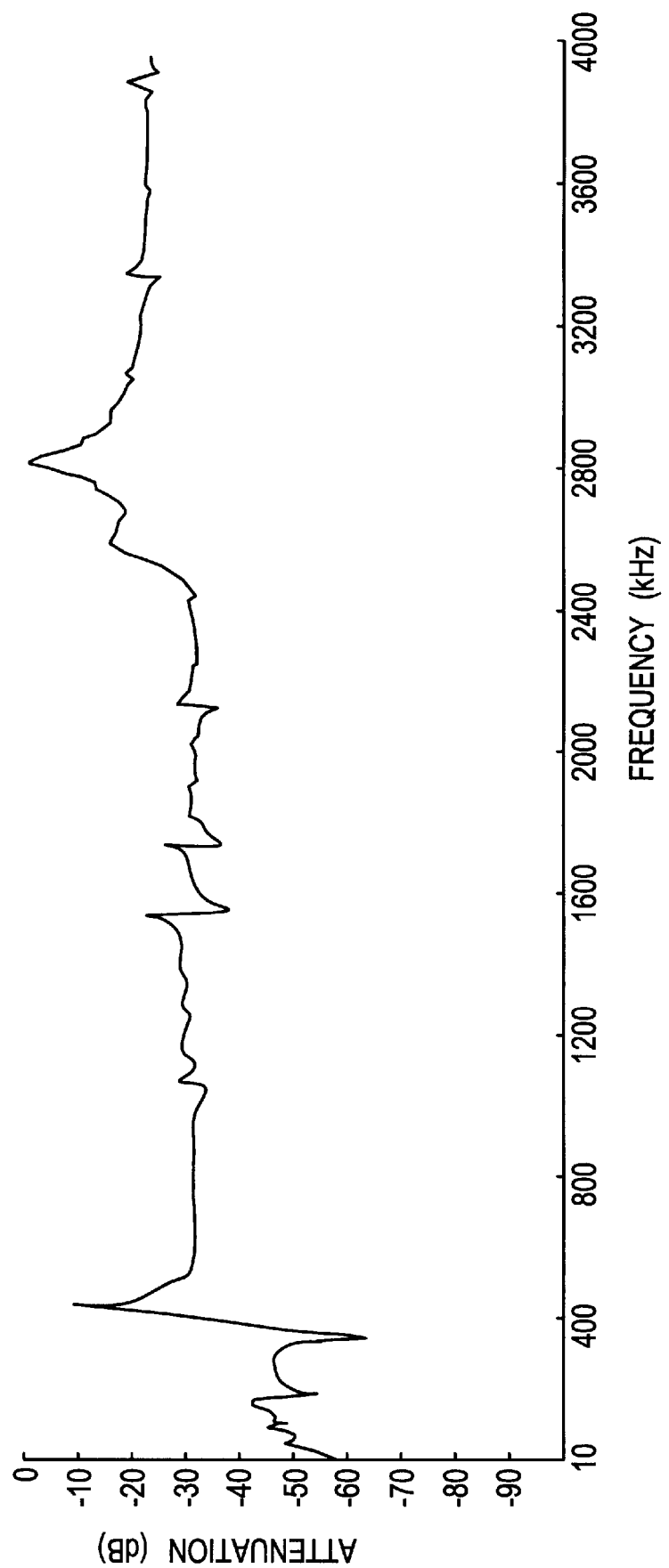
FIG. 28 is a diagram illustrating the frequency characteristics of the conventional piezo-resonator shown in FIG. 27.
Figure 29:
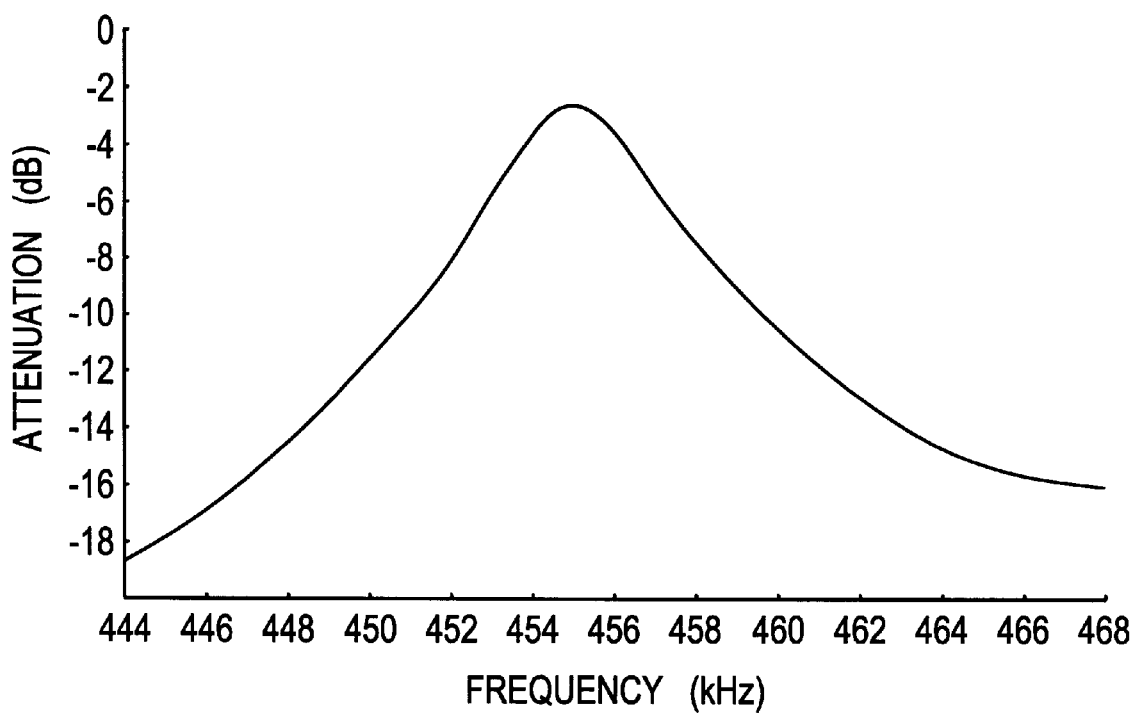
FIG. 29 is a diagram illustrating the frequency characteristics of and around the resonant frequency enlarged from the diagram of FIG. 28.
Figure 30:
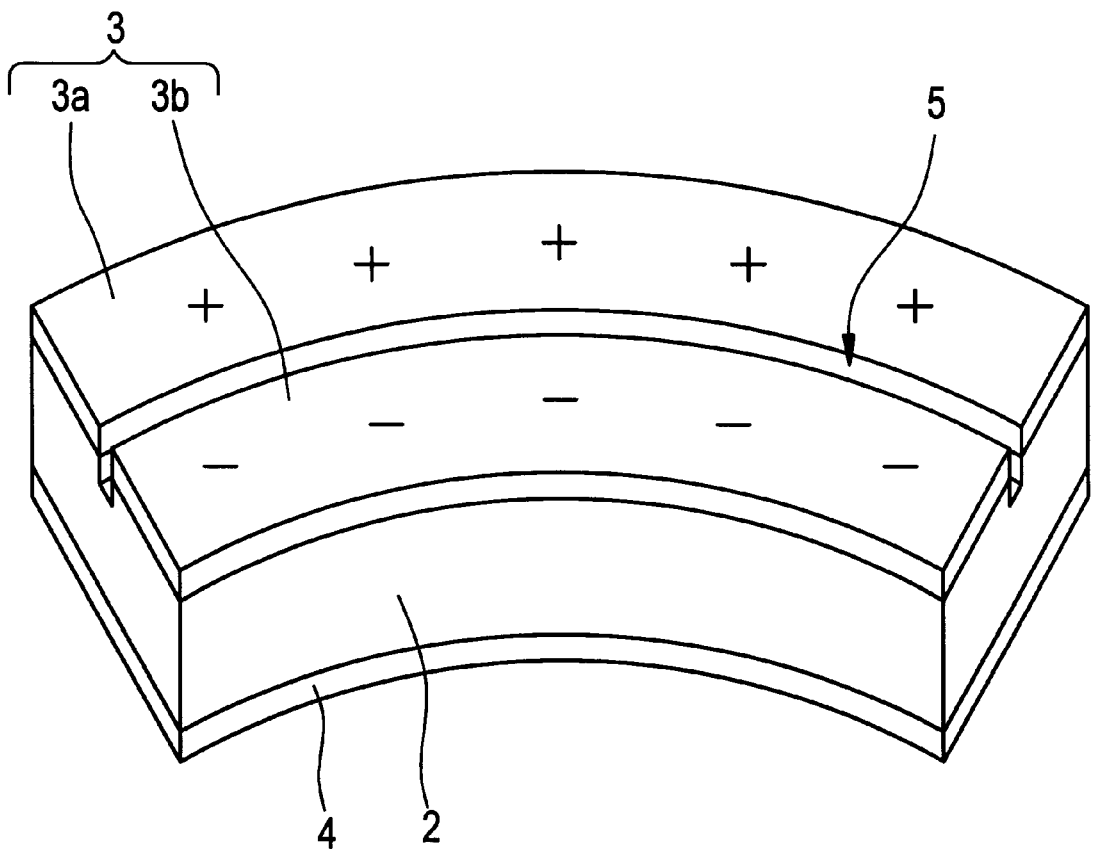
FIG. 30 illustrates the piezo-resonator shown in FIG. 27 when external impact is applied.

In the above-described modification, the peripheral portions 14a and 14e may be coupled to the central portion 14c, as illustrated in FIG. 26, to be used as one input/output terminal 22. The remaining portions 14b and 14d may be connected to serve as the other input/output terminal 24. In this connecting method, it is required that the divided portions be substantially symmetrical to each other with respect to the central line extending along the longitudinal substrate 12 in order to cancel electrical charges with opposite polarities produced due to external impact.

In the above preferred embodiments in which the electrode 14 is divided into more than three portions, if the total areas of the electrode portions connected to one input/output terminal 22 are made substantially equal to the total areas of the electrode portions coupled to the other input/output terminal 24, the capacitance between the input/output terminal 22 and the electrode 16 can be substantially the same as the capacitance between the other terminal 24 and the electrode 16. Thus, either of the input/output terminal 22 or 24 may be employed as an input terminal or as an output terminal, resulting in the same characteristics of the resonator 10. Additionally, equal widths of the all of the electrode portions can obviate the presence of an extremely small-width portion, thereby preventing damage to the piezoelectric substrate and electrodes during the micromachining of the resonator 10 with a dicer.

In this fashion, the electrode 14 of the piezo-resonator 10 may be divided into more than three portions, in which case, a suitable connecting method for the divided electrode portions may be used to offset electrical charges generated due to external impact. Any appropriate dividing method, i.e., whether or not the divided portions be symmetrical to each other with respect to the central line, may be employed depending on the selected connecting method. No matter which method is employed, the two peripheral portions are required to be substantially symmetrical to each other about the central line of the substrate 12.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezo-resonator comprising:

a piezoelectric substrate; and electrodes disposed on opposite surfaces of the piezoelectric substrate;

a plurality of grooves extending along a longitudinal direction of the piezoelectric substrate and through said electrodes and said piezoelectric substrate such that said electrodes are divided into at least three portions so as to form a divided electrode, and at least two of the at least three electrode portions of the divided electrode being substantially symmetrical to each other with respect to a central axis extending along the piezoelectric substrate in the longitudinal direction thereof;

wherein two input/output terminals and a ground terminal are respectively defined by the divided electrode and another of the electrodes, and the at least two of the at least three electrode portions of the divided electrode are connected to each other to define one of the input/output terminals.

2. A piezo-resonator according to claim 1, wherein the divided electrode is divided in such a manner that the at least three electrode portions are substantially parallel to the central axis of the piezoelectric substrate and comprise two peripheral electrode portions and a central electrode portion, and a total width of the two peripheral electrode portions is substantially equal to a width of the central electrode portion.

3. A piezo-resonator according to claim 1, wherein the divided electrode is divided in such a manner that the at least three electrode portions are substantially parallel to the central axis, and comprise two peripheral electrode portions and a central electrode portion, and a width of each of the two peripheral electrode portions is substantially equal to a width of the central electrode portion.

4. A piezo-resonator according to claim 1, further comprising a conductive support member and an insulating substrate having a pattern electrode disposed thereon, wherein the conductive support member is fixed to the divided electrode at a node of the piezoelectric substrate, and the divided electrode is connected by the support member to the pattern electrode on the insulating substrate.

* * * * *